(12) United States Patent
Hsiao et al.

(10) Patent No.: US 11,189,522 B2
(45) Date of Patent: Nov. 30, 2021

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Meng-Hsuan Hsiao, Hsinchu (TW); Yee-Chia Yeo, Hsinchu (TW); Tung Ying Lee, Hsinchu (TW); Chih Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/939,391

(22) Filed: Jul. 27, 2020

(65) Prior Publication Data
US 2020/0357684 A1  Nov. 12, 2020

Related U.S. Application Data

(60) Continuation of application No. 16/594,312, filed on Oct. 7, 2019, now Pat. No. 10,727,110, which is a
(Continued)

(51) Int. Cl.
*H01L 21/768* (2006.01)
*H01L 27/088* (2006.01)
(Continued)

(52) U.S. Cl.
CPC .. *H01L 21/76802* (2013.01); *H01L 21/28008* (2013.01); *H01L 21/76831* (2013.01);
(Continued)

(58) Field of Classification Search
CPC ..... H01L 21/28; H01L 21/203; H01L 21/768; H01L 21/845; H01L 21/8234;
(Continued)

(56) References Cited

U.S. PATENT DOCUMENTS 6,998,676 B2  2/2006  Kondo et al.
8,537,608 B2  9/2013  Juengling
(Continued)

FOREIGN PATENT DOCUMENTS

TW  201620023 A  6/2016
TW  201628079 A  8/2016

OTHER PUBLICATIONS

Notice of Allowance issued in corresponding U.S. Appl. No. 16/594,312, dated Mar. 19, 2020.
(Continued)

*Primary Examiner* — Chuong A Luu
(74) *Attorney, Agent, or Firm* — McDermott Will & Emery LLP

(57) ABSTRACT

In a method of forming a semiconductor device including a fin field effect transistor (FinFET), a first sacrificial layer is formed over a source/drain structure of a FinFET structure and an isolation insulating layer. The first sacrificial layer is patterned, thereby forming an opening. A first liner layer is formed on the isolation insulating layer in a bottom of opening and at least side faces of the patterned first sacrificial layer. After the first liner layer is formed, a dielectric layer is formed in the opening. After the dielectric layer is formed, the patterned first sacrificial layer is removed, thereby forming a contact opening over the source/drain structure. A conductive layer is formed in the contact opening.

20 Claims, 37 Drawing Sheets

Related U.S. Application Data division of application No. 16/049,715, filed on Jul. 30, 2018, now Pat. No. 10,483,157, which is a division of application No. 15/620,063, filed on Jun. 12, 2017, now Pat. No. 10,037,912.

(60) Provisional application No. 62/434,135, filed on Dec. 14, 2016.

(51) Int. Cl.
| | | |
|---|---|---|
| *H01L 21/28* | (2006.01) | |
| *H01L 29/417* | (2006.01) | |
| *H01L 21/8234* | (2006.01) | |
| *H01L 27/108* | (2006.01) | |
| *H01L 29/78* | (2006.01) | |

(52) U.S. Cl.
CPC .. *H01L 21/76837* (2013.01); *H01L 21/76877* (2013.01); *H01L 21/76897* (2013.01); *H01L 21/823431* (2013.01); *H01L 21/823475* (2013.01); *H01L 21/823481* (2013.01); *H01L 27/0886* (2013.01); *H01L 29/41791* (2013.01); *H01L 21/823418* (2013.01); *H01L 27/10879* (2013.01); *H01L 2029/7858* (2013.01)

(58) Field of Classification Search
CPC ........... H01L 21/8238; H01L 21/76802; H01L 21/76831; H01L 21/76877; H01L 21/28008; H01L 21/823431; H01L 21/823475; H01L 21/823481; H01L 21/76897; H01L 21/76837; H01L 21/823418; H01L 21/823821; H01L 29/66; H01L 29/78; H01L 29/417; H01L 29/785; H01L 29/41791; H01L 29/7848; H01L 29/165; H01L 29/66795; H01L 29/66545; H01L 29/6656; H01L 27/1211; H01L 27/088; H01L 27/092; H01L 27/0886; H01L 27/0924; H01L 27/108; H01L 27/10879; H01L 27/10826; H01L 2029/7858
USPC .......................................................... 257/401
See application file for complete search history.

(56) References Cited

U.S. PATENT DOCUMENTS

| | | | |
|---|---|---|---|
| 8,629,511 B2 * | 1/2014 | Koburger, III | ............................... H01L 21/823431 257/392 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,318,581 B1 | 4/2016 | Guo et al. | |
| 9,331,074 B1 | 5/2016 | Chang et al. | |
| 9,391,171 B2 * | 7/2016 | Chan | ..................... H01L 21/845 |
| 9,520,482 B1 | 12/2016 | Chang et al. | |
| 9,576,814 B2 | 2/2017 | Wu et al. | |
| 9,786,764 B2 | 10/2017 | Park et al. | |
| 10,374,040 B1 | 8/2019 | Chanemougame et al. | |
| 2007/0176223 A1 * | 8/2007 | Chindalore | ............ B82Y 10/00 257/314 |
| 2011/0291196 A1 | 12/2011 | Wei et al. | |
| 2014/0264632 A1 | 9/2014 | Richter et al. | |
| 2015/0008525 A1 * | 1/2015 | Fukuzaki | .............. H01L 23/367 257/368 |
| 2015/0021710 A1 | 1/2015 | Hsu et al. | |
| 2015/0137194 A1 | 5/2015 | Wei | |
| 2015/0214059 A1 | 7/2015 | Bouche et al. | |
| 2015/0214228 A1 | 7/2015 | Koh et al. | |
| 2015/0325575 A1 | 11/2015 | Park et al. | |
| 2016/0013308 A1 | 1/2016 | Lee et al. | |
| 2016/0099342 A1 | 4/2016 | Basker et al. | |
| 2016/0190325 A1 | 6/2016 | Liu et al. | |
| 2016/0204215 A1 | 7/2016 | Chang et al. | |
| 2016/0284697 A1 | 9/2016 | Yoon et al. | |
| 2016/0336320 A1 | 11/2016 | Lin | |
| 2017/0141199 A1 | 5/2017 | Demuynck et al. | |
| 2017/0154966 A1 | 6/2017 | Huang et al. | |
| 2017/0170172 A1 | 6/2017 | Cheng et al. | |
| 2017/0170179 A1 | 6/2017 | Seo | |
| 2017/0365674 A1 | 12/2017 | Lee et al. | |
| 2018/0263684 A1 | 9/2018 | Lee et al. | |
| 2018/0269305 A1 | 9/2018 | Bao et al. | |
| 2020/0035549 A1 | 1/2020 | Wu | |

OTHER PUBLICATIONS

Non-Final Office Action issued in corresponding U.S. Appl. No. 16/594,312, dated Dec. 11, 2019.

Non-Final Office Action issued in related U.S. Appl. No. 16/594,278, dated Mar. 31, 2020.

Office Action issued in related U.S. Appl. No. 15/620,063, dated Dec. 6, 2017.

Notice of Allowance issued in related U.S. Appl. No. 15/620,063, dated Mar. 28, 2018.

Notice of Allowance issued in corresponding U.S. Appl. No. 16/049,715, dated Jul. 11, 2019.

* cited by examiner

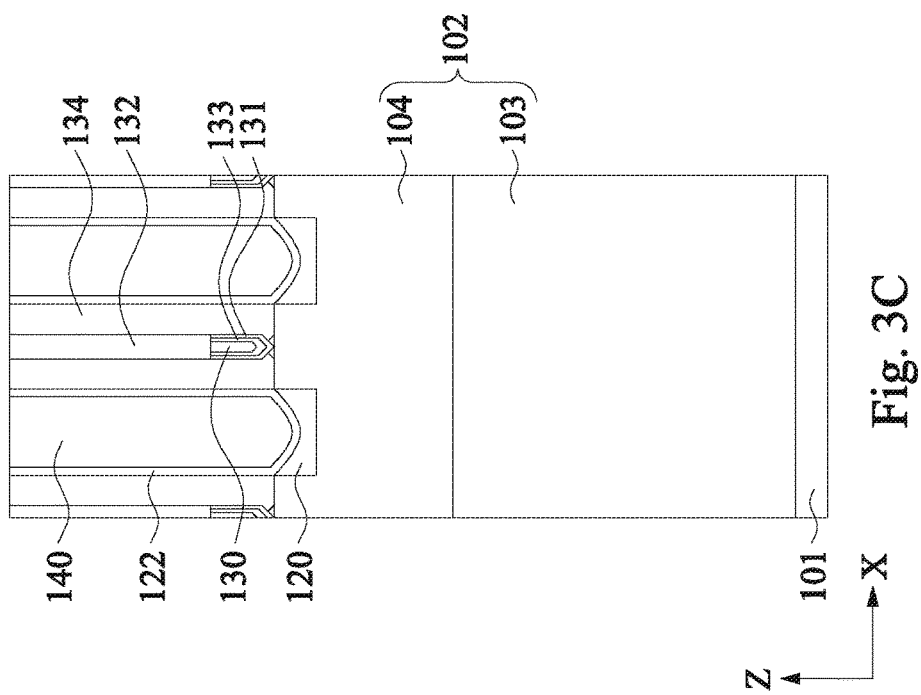
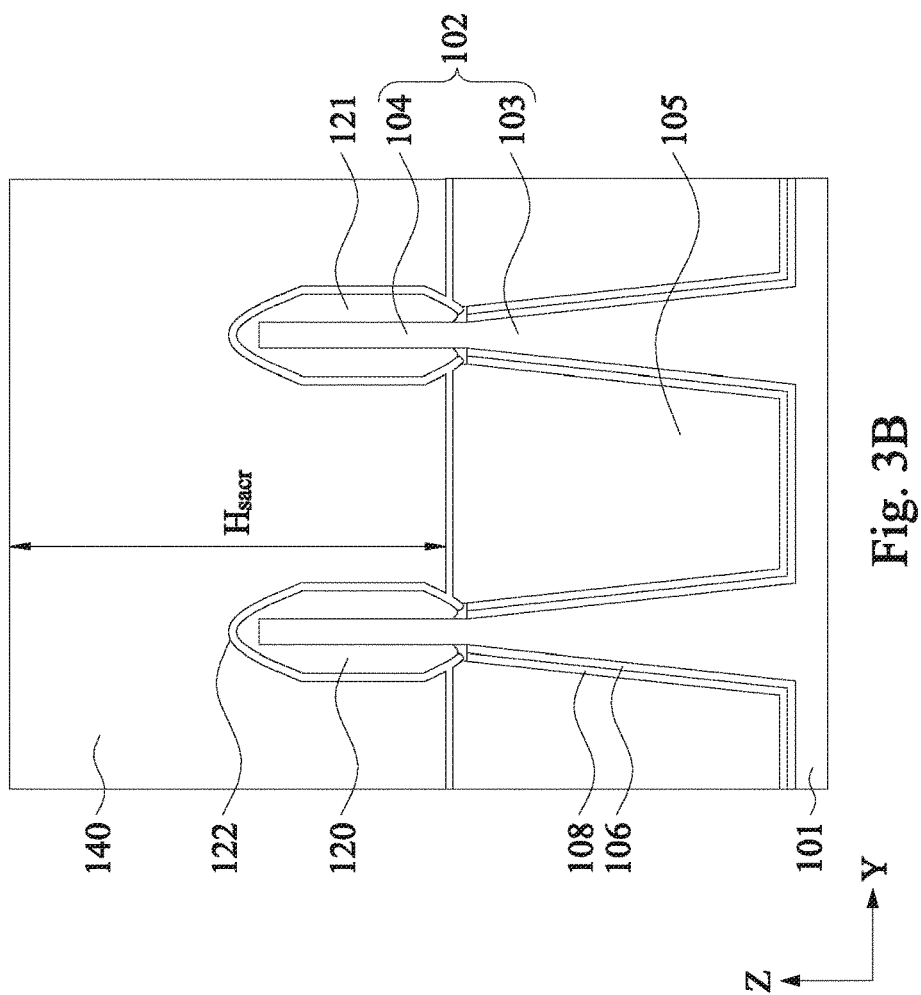

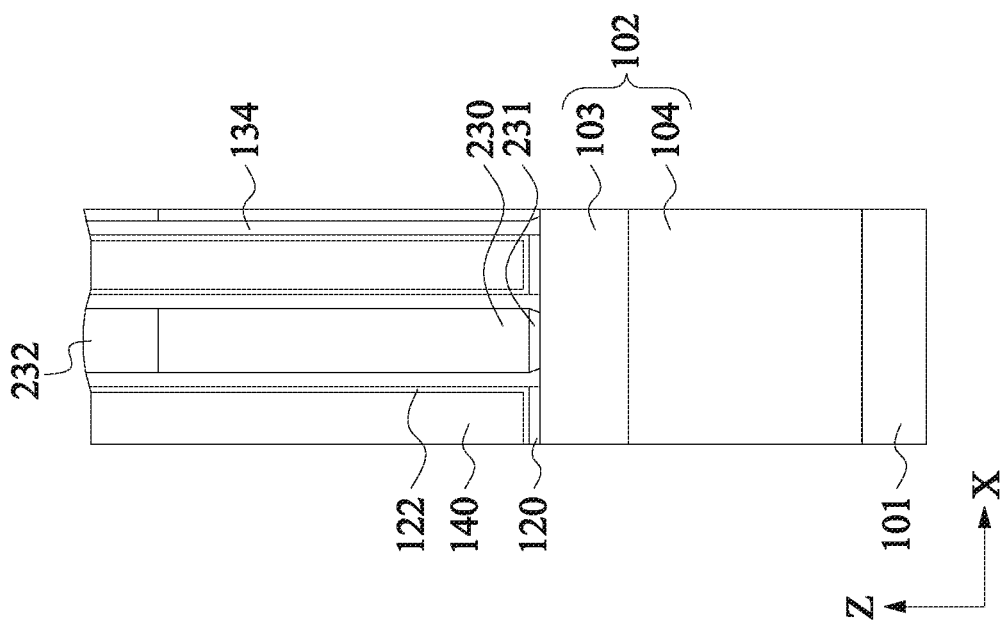
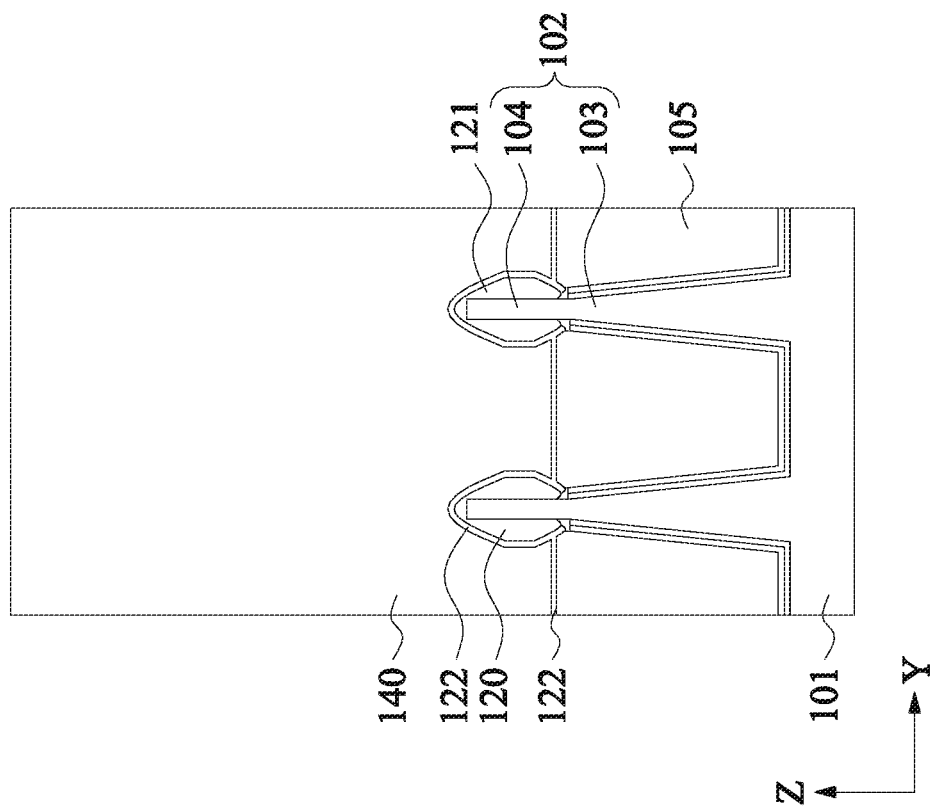

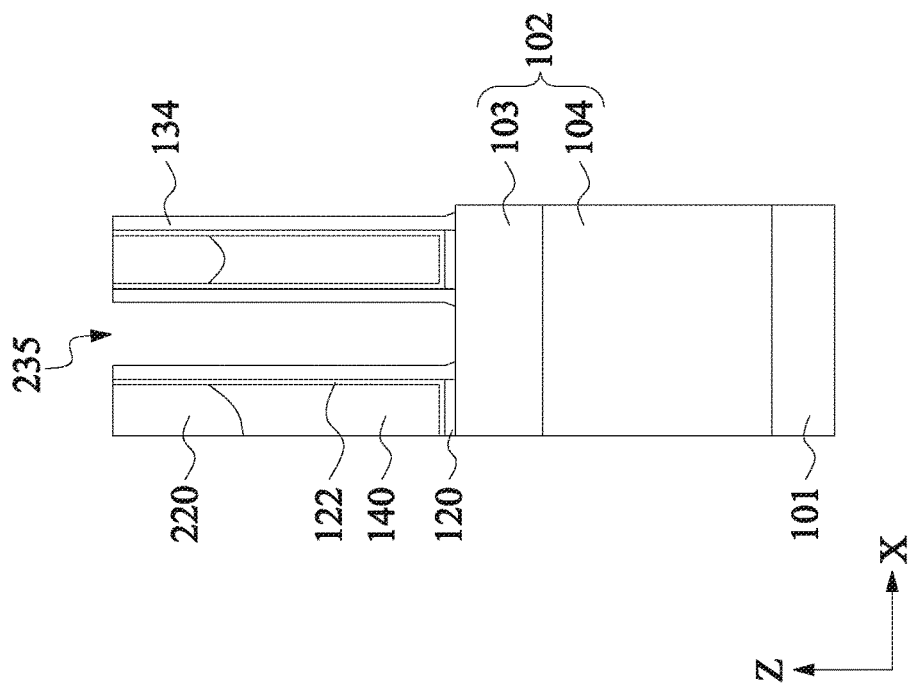
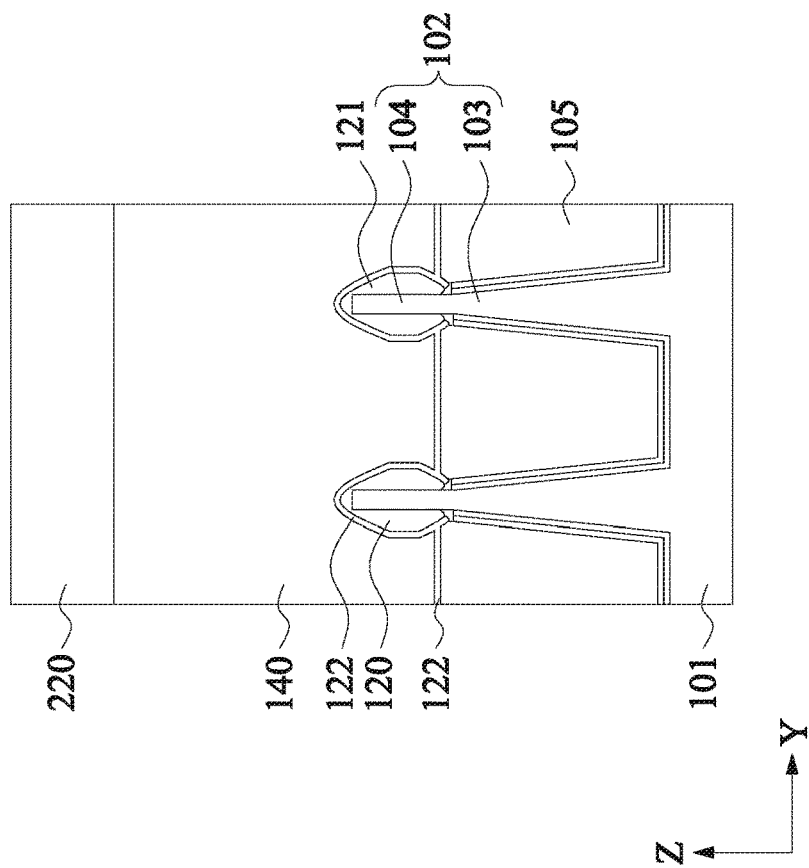
Fig. 12C
Fig. 12B

SEMICONDUCTOR DEVICE AND METHOD OF MANUFACTURING THE SAME

CROSS-REFERENCE TO RELATED APPLICATIONS

This application is a continuation application of U.S. patent application Ser. No. 16/594,312 filed Oct. 7, 2019, which is a divisional application of U.S. patent application Ser. No. 16/049,715 filed Jul. 30, 2018, now U.S. Pat. No. 10,483,157, which is a divisional application of U.S. patent application Ser. No. 15/620,063 filed Jun. 12, 2017, now U.S. Pat. No. 10,037,912, which claims priority to U.S. Provisional Patent Application 62/434,135 filed Dec. 14, 2016, the entire disclosure of each of which is incorporated herein by reference.

TECHNICAL FIELD

The disclosure relates to methods of manufacturing semiconductor integrated circuits, and more particularly to methods of manufacturing semiconductor devices including fin field effect transistors (FinFETs), and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B and 3C illustrate one of the various process stages in a semiconductor device fabrication process according to some embodiments of the present disclosure.

FIGS. 9A, 9B and 9C illustrate one of the various process stages in a semiconductor device fabrication process according to other embodiments of the present disclosure.

FIGS. 12A, 12B and 12C illustrate one of the various process stages in a semiconductor device fabrication process according to other embodiments of the present disclosure.

DETAILED DESCRIPTION

Figure 1A:
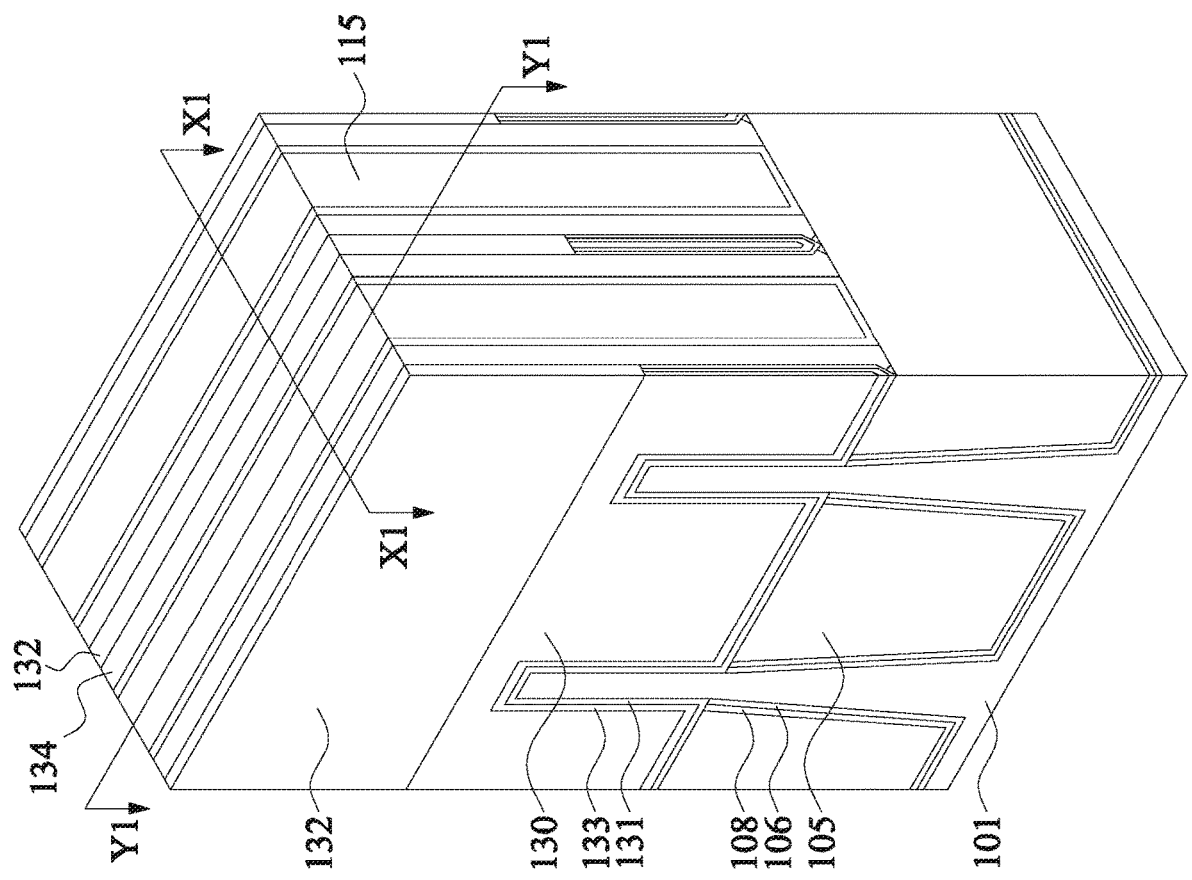
FIGS. 1A, 1B and 1C illustrate one of the various process stages in a semiconductor device fabrication process according to some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Disclosed embodiments relate to a method of forming contacts to source/drain (S/D) structures for fin field-effect transistors (FinFETs), including a method of patterning openings for the contact over the S/D structures. The embodiments such as those disclosed herein are generally applicable not only to FinFETs but also to double-gate, surround-gate, omega-gate or gate-all-around transistors, 2-dimensional FET and/or nanowire transistors, or any suitable device having a source/drain epitaxial growth process.

FIGS. 1A-7C illustrate various processes in a semiconductor device fabrication process in accordance with some embodiments of the present disclosure. Throughout the various views and illustrative embodiments, like reference numbers are used to designate like elements. In FIGS. 1A-7C, the "A" figures (e.g., FIGS. 1A, 2A, etc.) illustrate a perspective view, the "B" figures (e.g., FIGS. 1B, 2B, etc.) illustrate a cross-sectional view along the Y direction corresponding to line Y1-Y1 illustrated in FIG. 1A, and the "C" figures (e.g., FIG. 1C, 2C, etc.) illustrate a cross-sectional view along the X direction corresponding to line X1-X1 illustrated in FIG. 1A. It is understood that additional operations can be provided before, during, and after processes shown by FIGS. 1A-7C, and some of the operations described below can be replaced or eliminated, for additional embodiments of the method. The order of the operations/processes may be interchangeable.

Figure 1C:
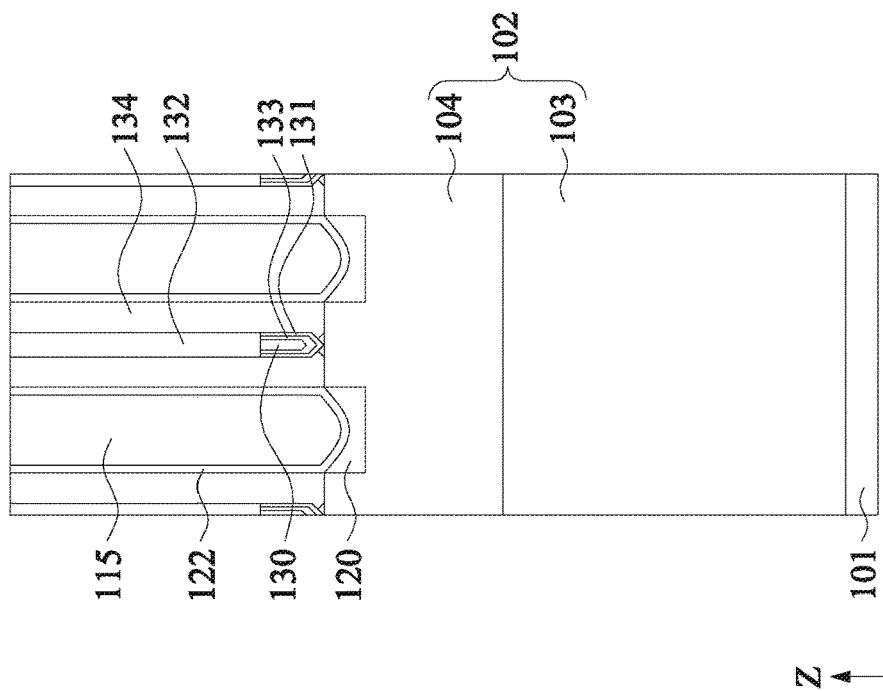
Figure 1B:
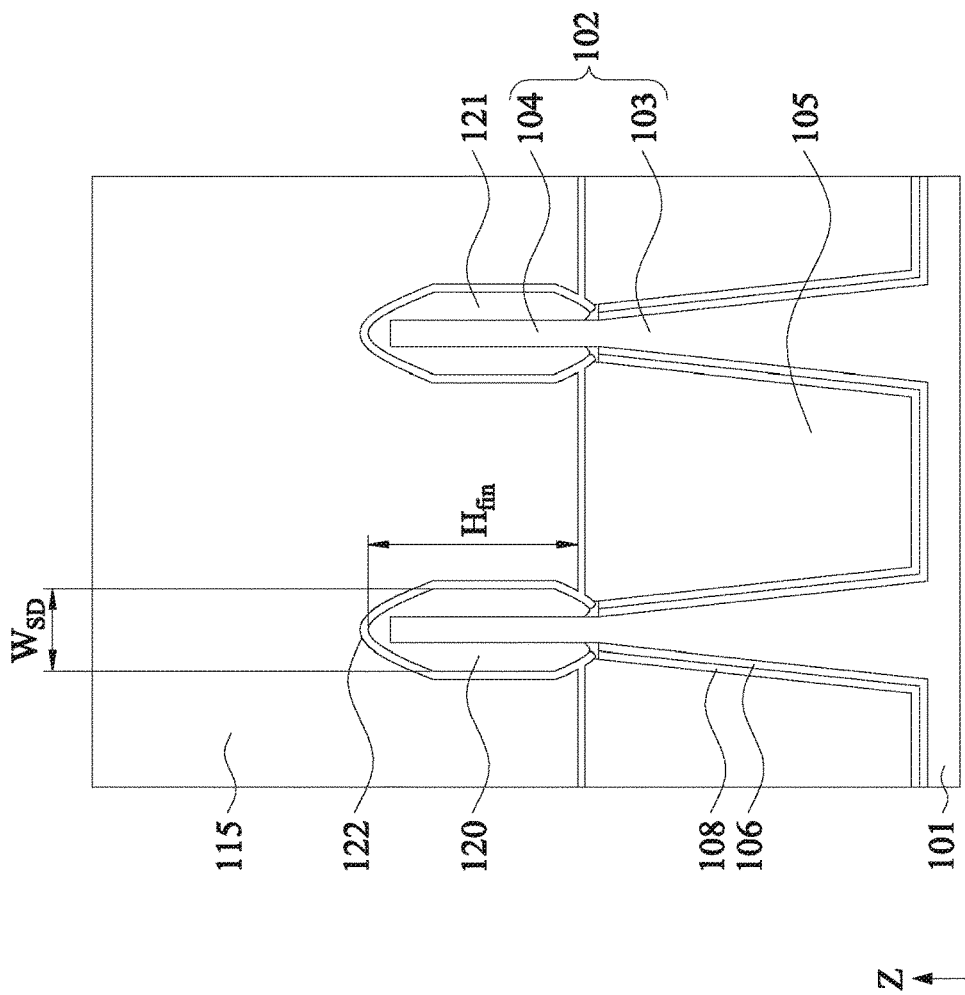

Referring first to FIGS. 1A-1C, FIGS. 1A-1C illustrate the structure after various manufacturing operations to form a FinFET structure are performed. As shown in FIGS. 1A-1C, source/drain (S/D) structures 120 and 121 and a metal gate 130 together with a work function adjustment layer 133 and a gate dielectric layer 131 are formed over a substrate 101. In some embodiments, the S/D structure 120 is for a p-channel FET and the S/D structure 121 is for an n-channel FET (i.e., different conductivity types). In other embodiments, both the S/D structures 120, 121 are for p-channel FETs or for n-channel FETs (i.e., the same conductivity type). This structure may be formed by the following manufacturing operations.

In FIGS. 1A-1C, there is shown a substrate 101 having one or more fin structures, with two fin structures 102 being illustrated. It is understood that two fin structures are shown for purposes of illustration, but other embodiments may include any number of fin structures. In some embodiments, one or more dummy fin structures are formed adjacent to the fin structure for an active FinFET. The fin structure 102 extends in the X direction and protrudes from the substrate in the Z direction, while the gate 130 extends in the Y direction.

The substrate 101 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 101 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 101 may include an epitaxial layer (epi-layer), which may be strained for performance enhancement, and/or may include a silicon-on-insulator (SOI) structure.

The fin structure 102 may be formed using, for example, a patterning process to form trenches such that a trench is formed between adjacent fin structures 102. As discussed in greater detail below, the fin structure 102 will be used to form a FinFET.

Isolation insulating layers, such as shallow trench isolations (STI) 105, are disposed in the trenches over the substrate 101. Prior to forming the isolation insulating layer 105, one or more liner layers are formed over the substrate 101 and sidewalls of the bottom part 103 of the fin structures 102 in some embodiments. In some embodiments, the liner layers includes a first fin liner layer 106 formed on the substrate 101 and sidewalls of the bottom part 103 of the fin structures 102, and a second fin liner layer 108 formed on the first fin liner layer 106. Each of the liner layers has a thickness between about 1 nm and about 20 nm in some embodiments.

In some embodiments, the first fin liner layer 106 includes silicon oxide and has a thickness between about 0.5 nm and about 5 nm, and the second fin liner layer 108 includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 105 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 105 is formed through a process such as CVD, flowable CVD (FCVD), or a spin-on-glass process, although any acceptable process may be utilized. Subsequently, portions of the isolation insulating layer 105 extending over the top surfaces of the fin structures 102, and portions of the liner layers over the top surfaces of the fin structures 102 are removed using, for example, an etch process, chemical mechanical polishing (CMP), or the like.

In some embodiments, the isolation insulating layer 105 and the liner layers are recessed to expose the upper portion 104 of the fin structure 102 as illustrated in FIGS. 1A-1C. In some embodiments, the isolation insulating layer 105 and the liner layers are recessed using a single etch processes, or multiple etch processes. In some embodiments in which the isolation insulating layer 105 is made of silicon oxide, the etch process may be, for example, a dry etch, a chemical etch, or a wet cleaning process. For example, the chemical etch may employ fluorine-containing chemical such as dilute hydrofluoric (DHF) acid. After the fin formation process, the fin height $H_{fin}$ is about 30 nm or higher, such as about 50 nm or higher, in some embodiments. In one embodiment, the fin height is between about 40 nm and about 80 nm. It is understood that the fin height may be modified by subsequent processing. Other materials, processes, and dimensions may be used.

After the fin structure 102 is formed, a dummy gate structure including a dummy gate dielectric layer and a dummy gate electrode are formed over the exposed fin structure 102. The dummy gate dielectric layer and the dummy gate electrode will be subsequently used to define and form the source/drain regions. In some embodiments, the dummy gate dielectric layer and the dummy gate electrode are formed by depositing and patterning a dummy dielectric layer formed over the exposed fin structures 102 and a dummy electrode layer over the dummy gate dielectric layer. The dummy dielectric layer may be formed by thermal oxidation, CVD, sputtering, or any other methods known and used in the art for forming a dummy dielectric layer. In some embodiments, the dummy dielectric layer may be made of one or more suitable dielectric materials, such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, $SiO_2$ is used.

Subsequently, the dummy electrode layer is formed over the dummy dielectric layer. In some embodiments, the dummy electrode layer is a conductive material and may be selected from a group comprising amorphous silicon, poly silicon, amorphous germanium, poly germanium, amorphous silicon-germanium, poly silicon-germanium, metallic nitrides, metallic silicides, metallic oxides, and metals. The dummy electrode layer may be deposited by PVD, CVD, sputter deposition, or other techniques known and used in the art for depositing conductive materials. Other materials, conductive and non-conductive, may be used. In one embodiment, poly-Si is used.

A mask pattern may be formed over the dummy electrode layer to aid in the patterning. The mask pattern is made of one or more layers of $SiO_2$, SiCN, SiON, $Al_2O_3$, SiN, or other suitable materials. By using the mask pattern as an etching mask, the dummy electrode layer is patterned into the dummy gate electrode. In some embodiments, the dummy dielectric layer is also patterned to define the dummy gate dielectric layer.

Subsequently, sidewall spacers 134 are formed along sidewalls of the dummy gate structure. The sidewall spacers 134 may be formed by depositing and anisotropically etching an insulating layer deposited over the dummy gate structures, the fin structure 102, and the isolation insulating layer 105. In some embodiments, the sidewall spacers 134 are formed of silicon nitride, and may have a single-layer structure. In alternative embodiments, the sidewall spacers 134 may have a composite structure including a plurality of layers. For example, the sidewall spacers 134 may include a silicon oxide layer and a silicon nitride layer over the silicon oxide layer. Other materials, such as $SiO_2$, SiCN, SiON, SiN, SiOCN, other low k material, or combinations thereof, may also be used. The thickness of the sidewall spacers 134 is in a range from about 5 nm to about 40 nm in some embodiments.

After the dummy gate structure and the sidewall spacers are formed, source/drain (S/D) structures 120 and 121 are formed on exposed portions 104 of the fin structures 102 along opposing sides of the dummy gate structure. The S/D structures 120 and 121 may be epitaxially formed on the side faces and the top face of the exposed fin structure 104. In some embodiments, the fin structure 104 may be recessed and the S/D structure is epitaxially formed on the exposed portion of the recessed fin. The use of epitaxial grown materials in the source/drain regions allows for the source/drain regions to exert stress in a channel of a FinFET. When the S/D structures 120 and 121 are for different conductivity type FETs, the S/D structure 120 is formed while the fin structure for the S/D structure 121 is covered by a protective layer made of, for example, SiN, and then the S/D structure 121 is formed while the formed S/D structure 120 is covered by a protective layer.

The materials used for the S/D structures 120 and 121 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. Other materials may be used. In some embodiments, the S/D structures 120 and/or 121 include two or more epitaxial layers with different composition and/or different dopant concentrations.

The S/D structures 120 and/or 121 may be doped either through an implanting process to implant appropriate dopants, or by in-situ doping as the material is grown. For example, for a p-channel FET where the channel may be Si or $Si_{1-x}Ge_x$, the doped epitaxial film may be boron-doped $Si_{1-y}Ge_y$, where y is equal to or larger than x to induce longitudinal compressive strain in the channel for hole mobility enhancement. For an n-channel FET where the channel may be Si, the doped epitaxial film may be, for example, phosphorus-doped silicon (Si:P) or silicon-carbon $(Si_{1-z}C_z:P)$. In the case where the channel is a compound semiconductor such as $In_m Ga_{1-m} As$, the doped epitaxial film may be, for example, $In_n Ga_{1-n} As$, where n is smaller than or equal to m.

As shown in FIGS. 1A and 1B, in some embodiments, the cross section of the S/D structures 120 and/or 121 in the Y direction have substantially a hexagonal shape, and in other embodiments, the cross section of the S/D structures 120 and/or 121 has a diamond shape, a pillar shape or a bar shape. The width $W_{SD}$ of the S/D structure in the Y direction is in a range from about 25 nm to about 100 nm in some embodiments.

After the S/D structures 120 and 121 are formed, a first insulating layer 122 as a liner layer or a contact etch stop layer (CESL) is deposited to cover the S/D structures 120 and 121 and on the sidewall spacers 134 of the dummy gate structure. The first insulating layer 122 acts as an etch stop during the patterning of a subsequently formed dielectric material. In some embodiments, the first insulating layer 122 includes $SiO_2$, SiCN, SiON, SiN or other suitable dielectric materials. In one embodiment, SiN is used. The first insulating layer 122 may be made of a plurality of layers that comprises combinations of the above mentioned materials. The first insulating layer 122 may be deposited through one or more processes such as PVD, CVD, or ALD, although any acceptable process may be utilized. Other materials and/or processes may be used. In some embodiments, the first insulating layer 122 has a thickness between about 0.5 nm and about 10 nm. Other thicknesses may be used in other embodiments.

After the first insulating layer 122 is formed, a first sacrificial layer 115 is formed over the first insulating layer 122. In some embodiments, the first sacrificial layer 115 includes one or more layers of silicon based dielectric material, such as $SiO_2$, SiCN, SiON, SiOC, SiOH, SiN, or other suitable dielectric materials. In some embodiments, the first sacrificial layer 115 is formed through a film forming process, such as, CVD, PVD, ALD, FCVD, or a spin-on-glass process, although any acceptable process may be utilized. Subsequently, portions of the first insulating layer 122 are removed using, for example, an etch process, CMP, or the like, to exposed the upper surface of the dummy gate electrode.

Subsequently, the dummy gate electrode and the dummy gate dielectric layer are removed. The removal process may include one or more etch processes. For example in some embodiments, the removal process includes selectively etching using either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$: $H_2O_2$:$H_2O$ (APM), $NH_2OH$, KOH, $HNO_3$,$NH_4F$:$H_2O$, and/ or the like. The dummy gate dielectric layer may be removed using a wet etch process, such as a dilute HF acid. Other processes and materials may be used.

After the dummy gate structure is removed, a gate dielectric layer 131 is formed over a channel region of the fin structure 104. In some embodiments, the gate dielectric layer 131 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of the gate dielectric layer 131 include molecular-beam deposition (MBD), ALD, PVD, and the like. In some embodiments, the gate dielectric layer 131 has a thickness of about 0.5 nm to about 5 nm. In some embodiments, the gate dielectric layer 131 is also formed on sides of the sidewall spacers 134.

In some embodiments, an interfacial layer (not shown) is formed over the channel region 104 prior to forming the gate dielectric layer 131, and the gate dielectric layer 131 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH$+$H_2O_2$+$H_2O$ (APM), or other methods. Other embodiments utilize a different material or processes for the interfacial layer. In some embodiment, the interfacial layer has a thickness of about 0.2 nm to about 1 nm.

After the gate dielectric layer 131 is formed, a gate electrode 130 is formed over the gate dielectric layer 131. The gate electrode 130 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrode 130 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 130 has a thickness in the range of about 5 nm to about 100 nm. The gate electrode 130 may be formed using a suitable process such as ALD, CVD, PVD, plating, or combinations thereof. A planarization process, such as a CMP, may be performed to remove excess materials.

In certain embodiments of the present disclosure, the gate electrode 130 includes one or more work function adjustment layers 133 disposed on the gate dielectric layer 131. The work function adjustment layer 133 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer. Other suitable conductive materials may be used.

Then, the gate electrode 130, the gate dielectric layer 131 and the work function adjustment layer are recessed, and a gate cap layer 132 is formed on the recessed gate electrode 130. In some embodiments, when the gate electrode 130 is mainly made of W, the gate electrode may be recessed using, for example, dry etch process using $Cl_2/O_2/BCl_3$, at a temperature range of 24° C. to 150° C., and at a pressure of below 1 Torr.

After recessing the gate electrode 130, the gate cap layer 132 is formed in the recess to protect the gate electrode 130 during subsequent processes. In some embodiments, the gate cap layer 132 includes $SiO_2$, SiCN, SiON, SiN, $Al_2O_3$, $La_2O_3$, SiN, a combination thereof, or the like, but other suitable dielectric films may be used. The gate cap layer 132 may be formed using, for example, CVD, PVD, spin-on, or the like. Other suitable process steps may be used. A planarization process, such as a CMP, may be performed to remove excess materials.

Figure 2A:
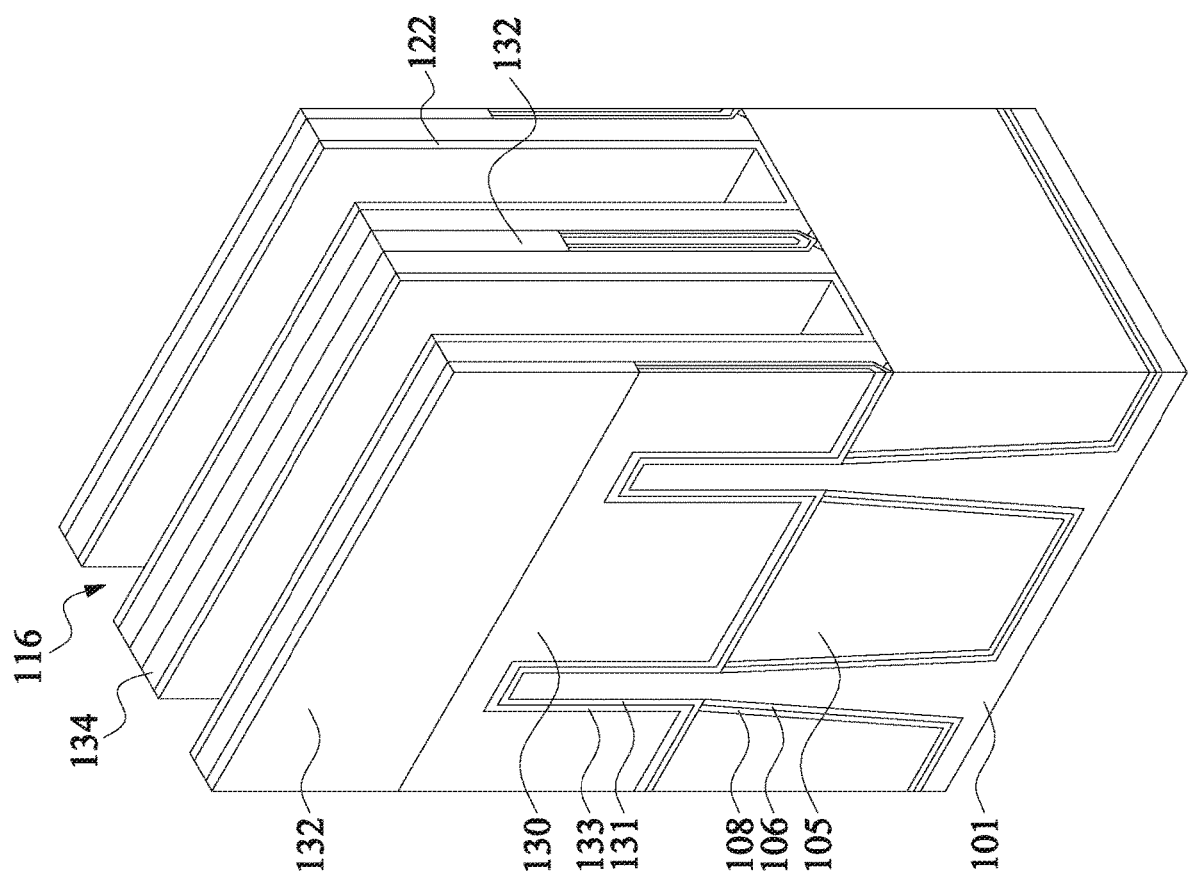
FIGS. 2A, 2B and 2C illustrate one of the various process stages in a semiconductor device fabrication process according to some embodiments of the present disclosure.
Figure 2C:
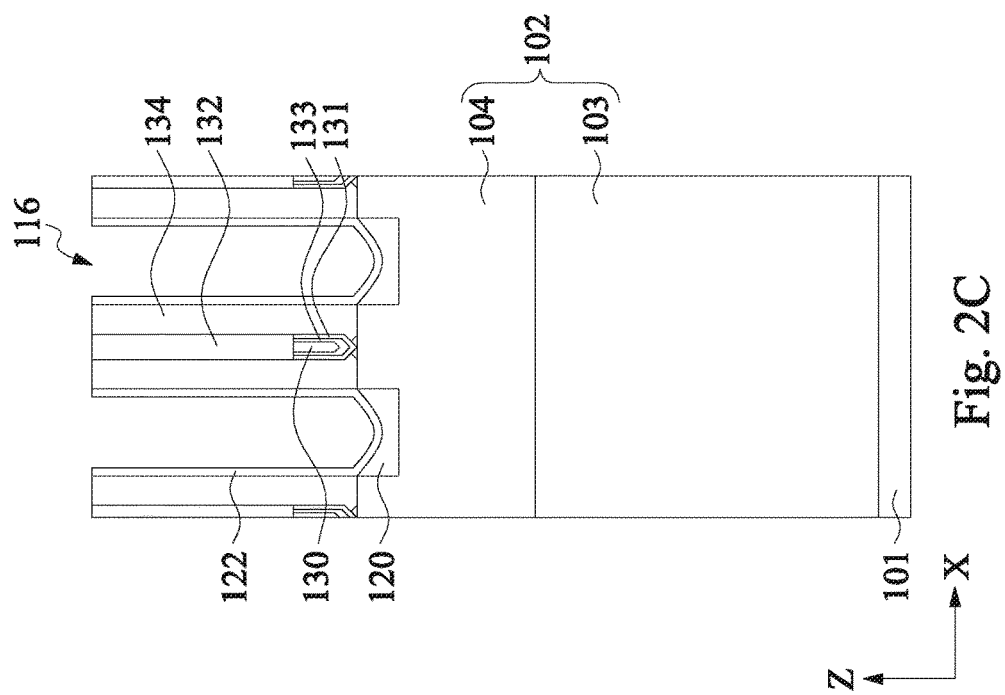
Figure 2B:
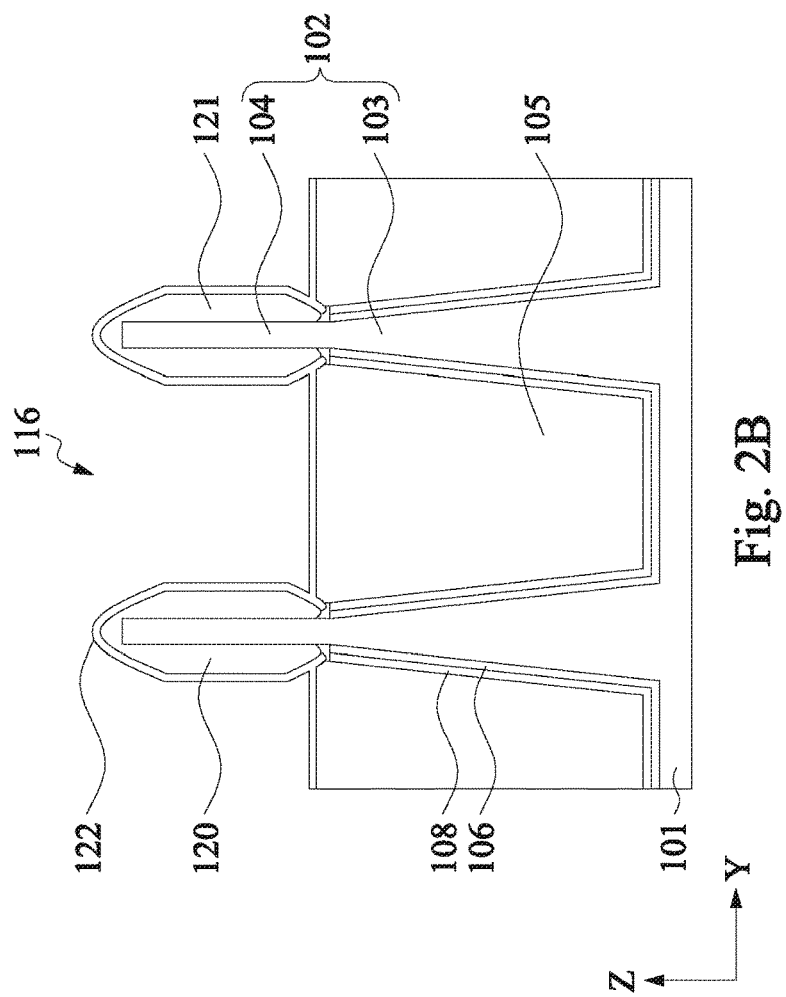

FIGS. 2A-2C show exemplary views of one of the various stages for manufacturing a FinFET device according to some embodiments of the present disclosure.

As shown in FIGS. 2A-2C, the first sacrificial layer 115 is at least partially removed from both side regions of the S/D structures 120 and 121, to form openings 116. In some embodiments, all of the first sacrificial layer 115 is removed. The first sacrificial layer 115 may be removed by suitable etching operations, such as dry etching and/or wet etching. The etching operation substantially stops at the first insulating layer 122. In some embodiments, the first insulating layer 122 has a thickness between about 0.5 nm and about 10 nm.

Figure 3A:
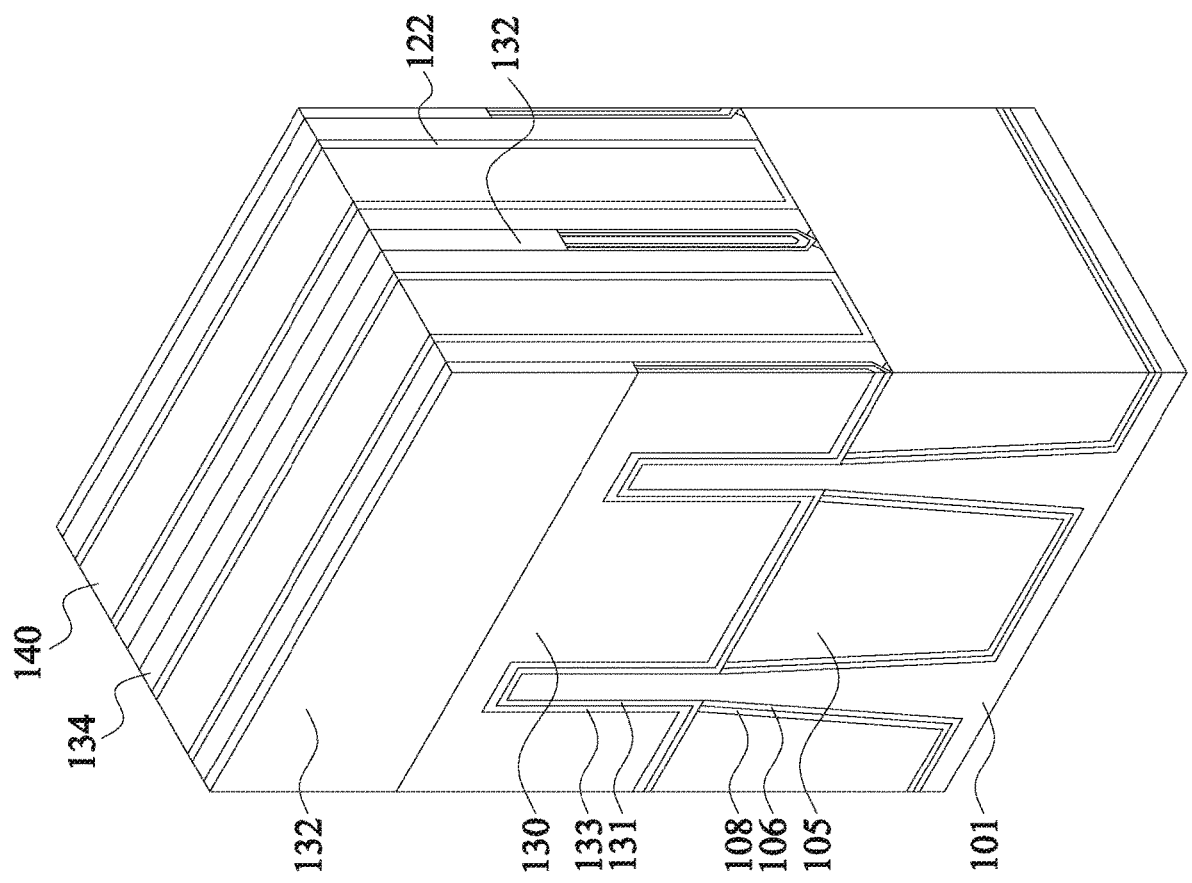

FIGS. 3A-3C show exemplary views of one of the various stages for manufacturing a FinFET device according to some embodiments of the present disclosure.

After the openings 116 are formed, a second sacrificial layer 140 is formed in the openings 116. The second sacrificial layer 140 is made of a material having a higher (e.g., 5 or more) etching selectivity with respect to the materials of the first insulating layer 122 and/or the isolation insulating layer 105. In some embodiments, the second sacrificial layer 140 is made of one or more layers of Group IV elemental or compound materials, such as Si, SiGe, SiC, Ge, SiGeC and GeSn, which may be crystalline, polycrystalline or amorphous and may be doped or un-doped. In other embodiments, the second sacrificial layer 140 is made of one or more silicon based dielectric layers of SiOC, SiC, SiON, SiCN, SiOCN, SiN and/or $SiO_2$, or other suitable materials. Aluminum based dielectric materials, such as aluminum oxide, aluminum oxy-carbide and aluminum oxy-nitride may be used. An SOC (spin-on-carbon) may also be used. In certain embodiments, the second sacrificial layer 140 is made of one or more layers of Group III-V compound semiconductors including, but not limited to, GaAs, GaN, InGaAs, InAs, InP, InSb, InAsSb, AN and/or AlGaN. The second sacrificial layer 140 may be deposited through one or more processes such as PVD, CVD, or ALD, although any acceptable process may be utilized. Other materials and/or processes may be used. In one embodiment, amorphous or poly Si is used as the second sacrificial layer 140. In other embodiments, amorphous or poly $Si_{1-x}Ge_x$, where x is equal to or less than 0.4 is used as the second sacrificial layer 140.

In some embodiments, the deposition temperature of the second sacrificial layer 140 is maintained below about 600° C. In other embodiments, the temperature is below about 500° C., and is below 400° C. in certain embodiments. The temperature is maintained low to minimize thermal impact on the threshold voltage of the metal-gate/high-k dielectric stack that has already been formed.

A planarization operation, such as, an etch-back process or CMP, may be performed to planarize the upper surface of the second sacrificial layer 140. By the planarization operation, the upper surface of the gate cap layer 132 is exposed. After the planarization operation, the height $H_{sacr}$ of the second sacrificial layer 140 measured from the surface of the first insulating layer 122 is in a range from about 100 nm to about 350 nm in some embodiments.

Figure 4A:
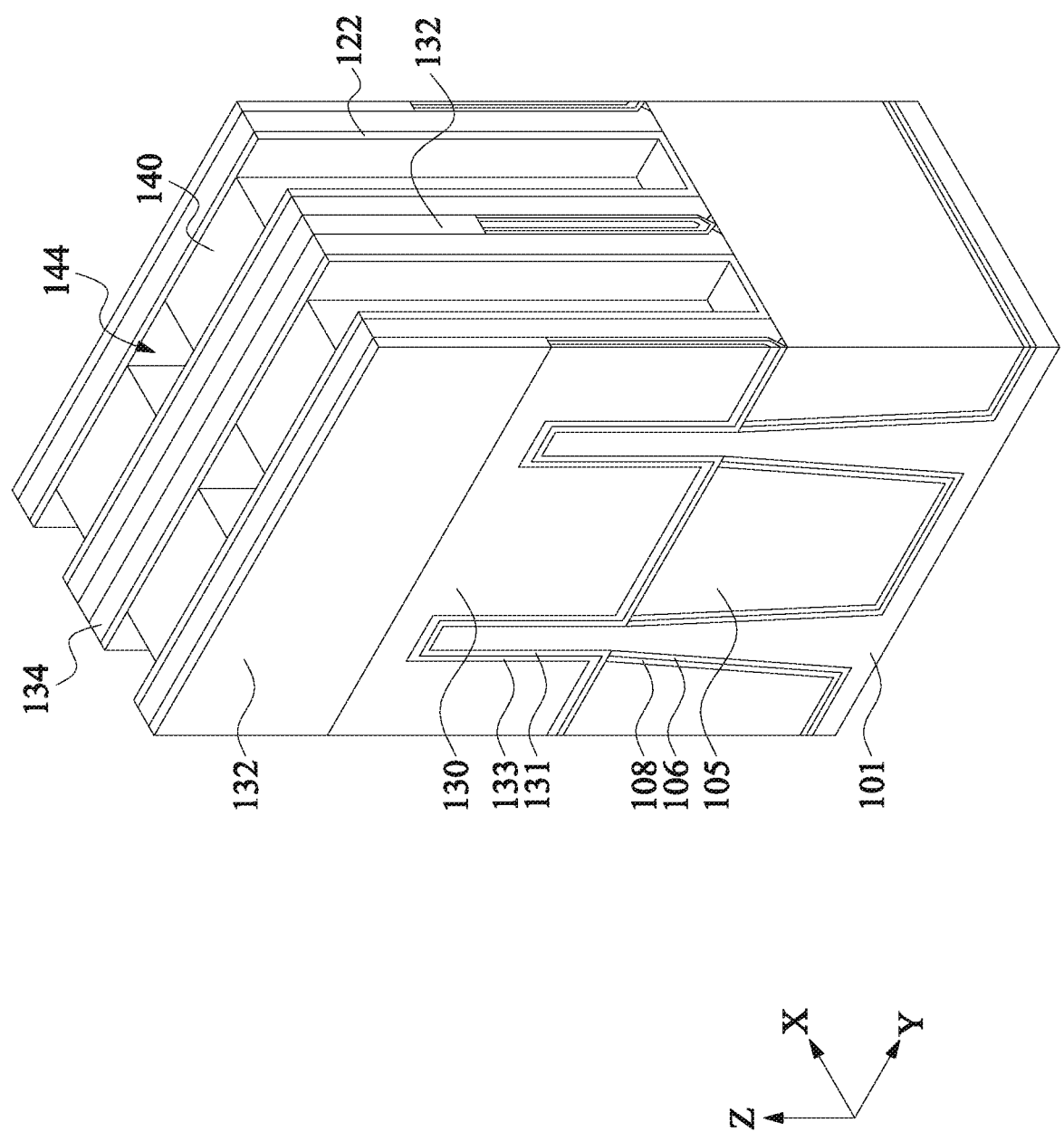
FIGS. 4A, 4B and 4C illustrate one of the various process stages in a semiconductor device fabrication process according to some embodiments of the present disclosure.
Figure 4C:
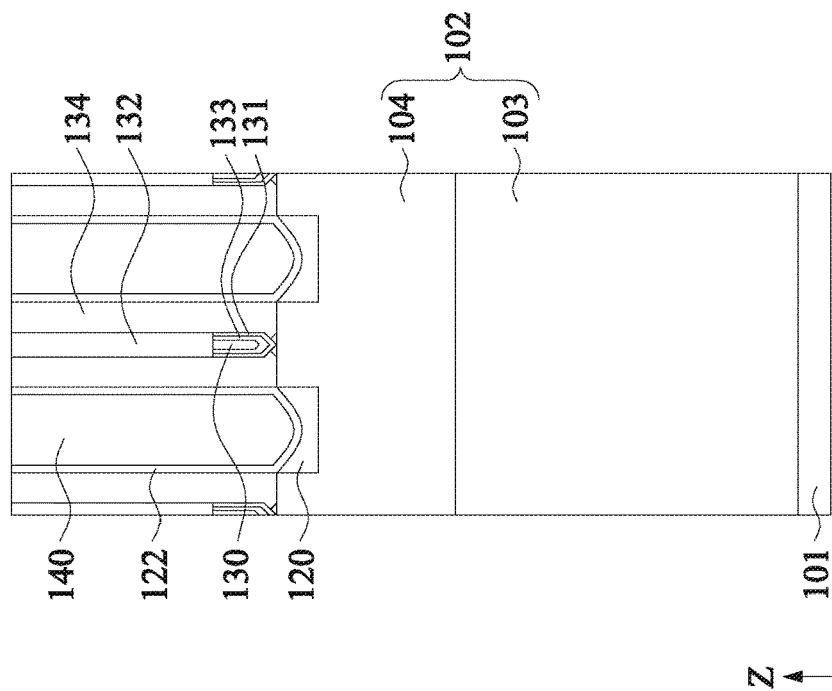
Figure 4B:
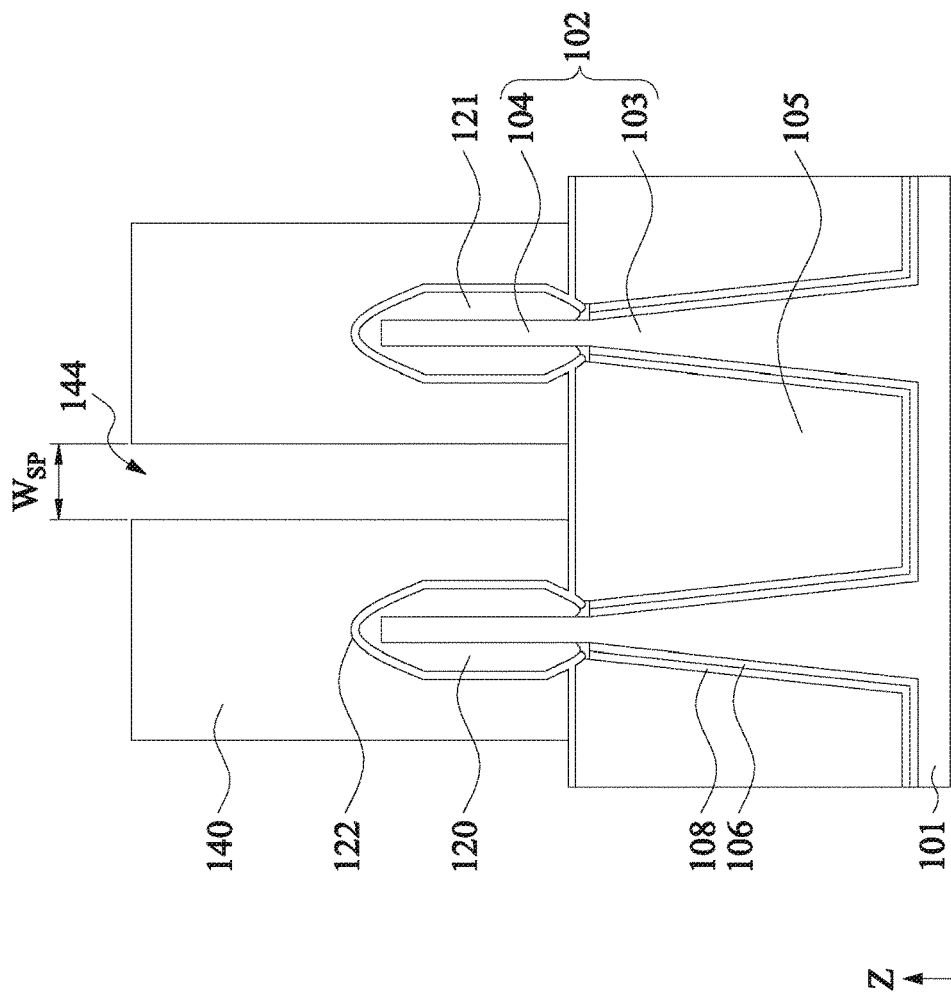

FIGS. 4A-4C show exemplary views of one of the various stages for manufacturing a FinFET device according to some embodiments of the present disclosure.

After the second sacrificial layer 140 is formed, a mask pattern is formed over the second sacrificial layer 140, and by using the mask pattern as an etching mask, the second sacrificial layer 140 is patterned by using dry etching, thereby forming openings 144 between the S/D structures 120 and 121. In some embodiment, the etching substantially stops at the first insulating layer 122. FIGS. 4A-4C show structure after the mask layer is removed.

The mask pattern may be formed by patterning a layer of suitable mask material using a photo-etching operation. The etching operation may include multiple etching processes using different plasma gases. In some embodiments, the mask pattern extends in the X direction over the second sacrificial layer 140 and the gate cap layer 132. The mask pattern is made of one or more layers of dielectric material, such as $SiO_2$, SiN and/or SiON, and/or TiN, or other suitable materials. The material for the mask pattern may be deposited through one or more processes such as PVD, CVD, or ALD, although any acceptable process may be utilized. Other materials and/or processes may be used.

When a Si based material (e.g., poly-Si or amorphous Si) is used as the second sacrificial layer 140, the etching can be performed by plasma dry etching using, for example, a gas including HBr or a gas including $Cl_2$ and $SF_6$. When SOC (spin-on-carbon) is used as the second sacrificial layer 140, the etching can be performed by plasma dry etching using, for example, a gas including $N_2$ and $H_2$ or a gas including $SO_2$ and $O_2$. When a Si oxide based material formed by FCVD is used as the second sacrificial layer, the etching can be performed by plasma dry etching using, for example, a gas including a fluorocarbon and/or fluorine.

When a Ge based material (e.g., Ge or SiGe) is used as the second sacrificial layer 140, the etching can be performed by plasma dry etching using, for example, a gas including a fluorocarbon or a gas including a halogen. During the etching, the substrate may be heated at a temperature between about 20° C. to about 200° C.

In some embodiments, the opening width $W_{sp}$ in the Y direction is in a range from about 5 nm to about 100 nm. In certain embodiments, the opening width $W_{sp}$ is in a range from about 10 nm to about 40 nm. The width $W_{sp}$ may be other values depending on design rules and/or types of semiconductor devices.

It is noted that as shown in FIGS. 4A and 4C, the first insulating layer 122 and/or the gate cap layer 132 are not substantially etched during the patterning of the second sacrificial layer 140 in some embodiments. In other words, the materials for the first insulating layer 122 and/or the gate cap layer 132 have a high etching selectivity (e.g., 5 or more) with respect to the second sacrificial layer 140 (i.e., lower etching rate than the second sacrificial layer).

Figure 5A:
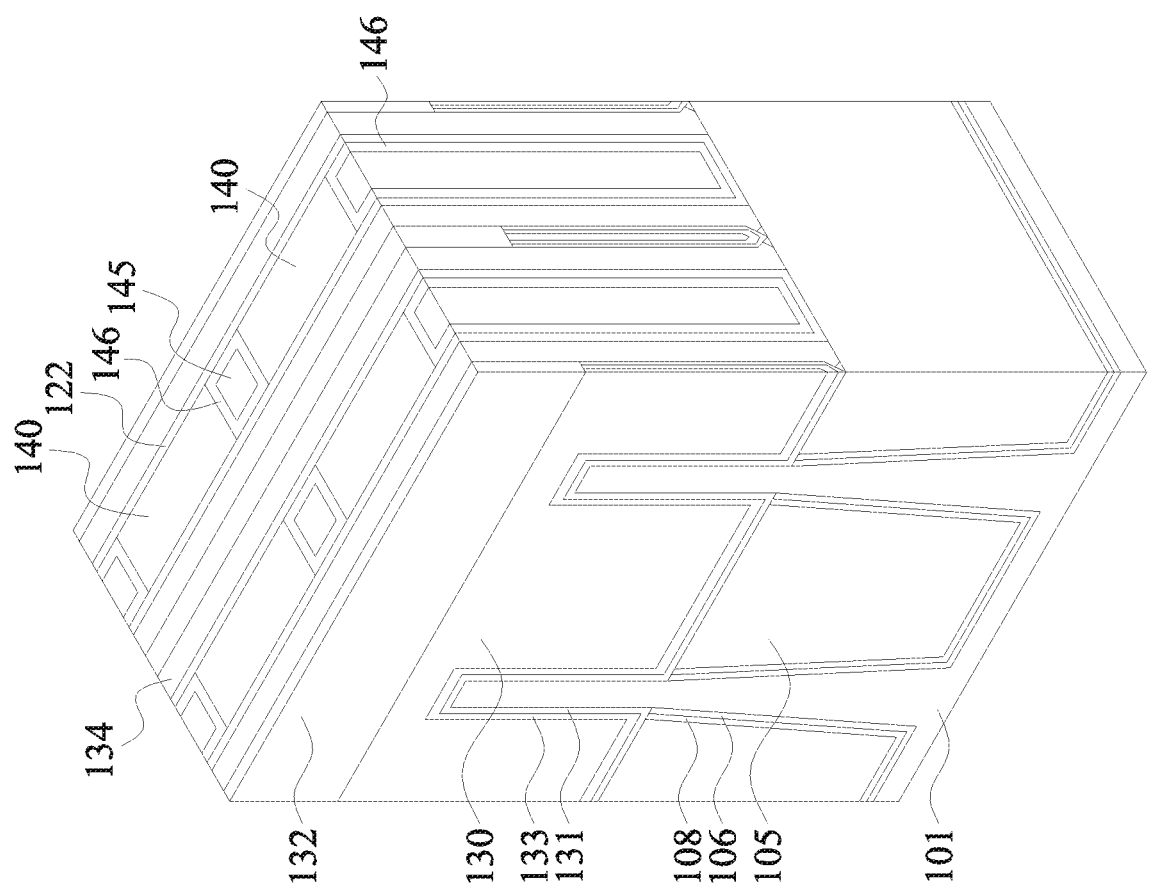
FIGS. 5A, 5B and 5C illustrate one of the various process stages in a semiconductor device fabrication process according to some embodiments of the present disclosure.
Figure 5C:
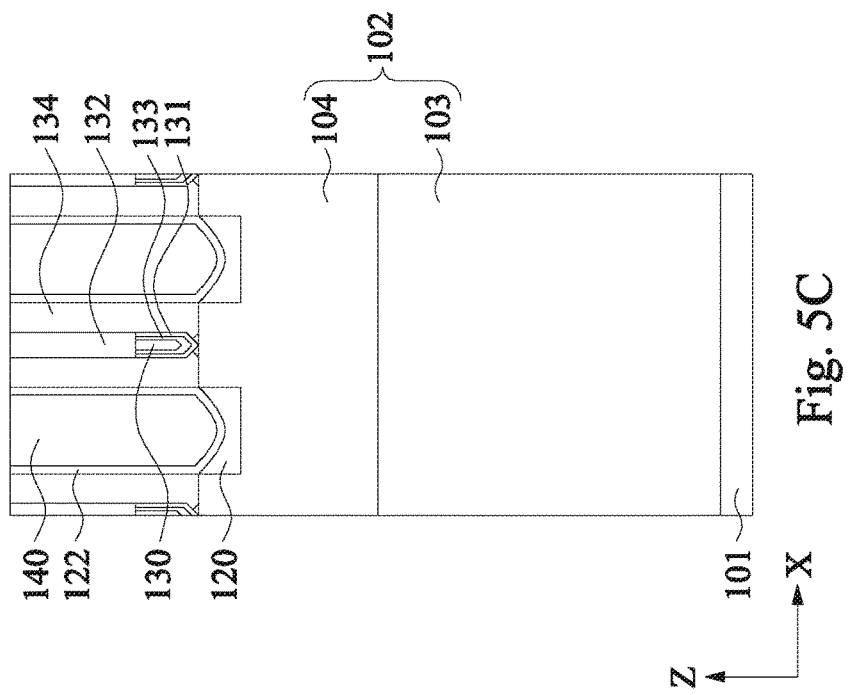
Figure 5B:
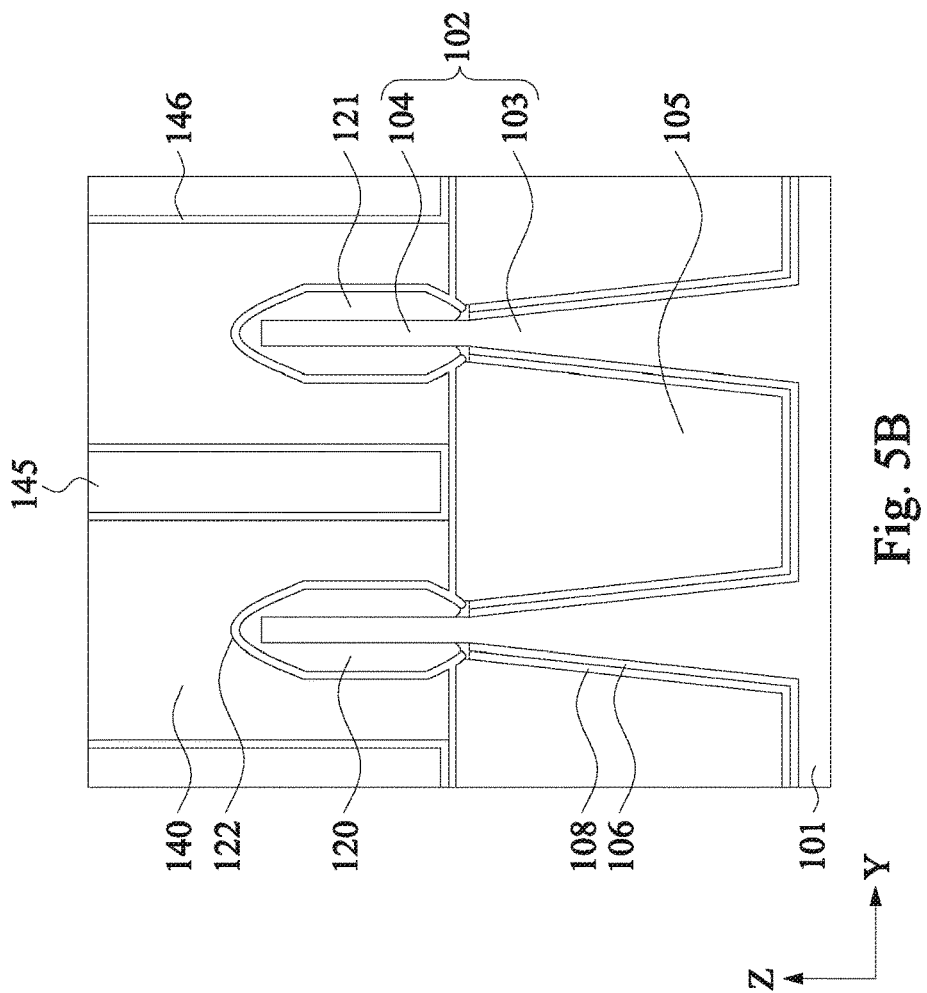

FIGS. 5A-5C show exemplary views of one of the various stages for manufacturing a FinFET device according to some embodiments of the present disclosure.

Subsequently, a second insulating layer 146, as a liner layer, is conformally formed over the patterned second sacrificial layer 140 and the isolation insulating layer 105. The second insulating layer 146 is also formed on the sidewall spacers 134 and the gate cap layer 132.

In some embodiments, the second insulating layer 146 includes $SiO_2$, SiCN, SiON, SiCN, SiOCN and SiN, but other suitable dielectric materials may be used. In one embodiment, silicon nitride based dielectric material, such as SiN, is used. The second insulating layer 146 may be made of a plurality of layers that comprises combinations of the above mentioned materials. In one embodiment, two layers of silicon based dielectric material, at least one of which is silicon nitride based material, are used as the second insulating layer 146. In other embodiments, an aluminum based dielectric layer is used as one layer of the second insulating layer 146. In certain embodiments, the second insulating layer 146 includes a silicon nitride based dielectric layer and a dielectric layer made of a material other than a silicon nitride based material.

The second insulating layer 146 has a higher selective etching ratio to silicon compared to the etching rate of $SiO_2$ to silicon. For example, the etching rates of silicon nitride, silicon oxide, and silicon in $H_3PO_4$ are respectively about 50:5:1.

The second insulating layer 146 may be deposited through one or more processes such as PVD, CVD, molecular layer deposition (MLD) or ALD, although any acceptable process may be utilized. Other materials and/or processes may be used. In the case of ALD, for example, $SiH_4$ (silane), $SiH_2Cl_2$ (dichlorosilane), and/or $SiCl_4$ (silicon tetrachloride), and/or other suitable silicon-containing precursor for the nitride-containing liner layer may be used as precursor for ALD process.

In some embodiments, the deposition temperature of the second insulating layer 146 is maintained below about 500° C. In other embodiments, the temperature is below about 400° C. The temperature is maintained low to minimize thermal impact on the threshold voltage of the metal-gate/high-k dielectric stack that has already been formed.

In some embodiments, the second insulating layer 146 has a thickness between about 1 nm and about 15 nm. In other embodiments, the thickness is about 3 nm to about 10 nm. Other thicknesses are used in other embodiments.

After the second insulating layer 146 is formed, a first interlayer dielectric (ILD) layer 145 is formed to fill the openings 144 and over the second sacrificial layer 140.

The ILD layer 145 may include a single layer or multiple layers. In some embodiments, the ILD layer 145 includes $SiO_2$, SiCN, SiOC, SiON, SiOCN, SiN or a low-k material, but other suitable dielectric film may be used. The ILD layer 145 may be formed by CVD, PECVD or ALD, FCVD, or a spin-on-glass process. A planarization process, such as a CMP process, may be performed to remove excess materials. By the planarization process, the upper surface of the second sacrificial layer 140 (and the cap insulation layer 132) is exposed in some embodiments.

When a FCVD is used, a curing process is performed on the flowable isolation dielectric precursor in some embodiments. The curing process may include UV curing, ozone ($O_3$) plasma curing or low-temperature $O_3$ plasma+UV curing (LTB+UV curing), so as to transfer the flowable isolation dielectric precursor into the dielectric layer, such as a silicon oxide layer. A processing temperature range of the UV curing process is between about 0° C. and about 10° C., in some embodiments. A processing temperature range of the $O_3$ plasma curing process is between about 100° C. and about 250° C. in some embodiments. A processing temperature range of the LTB+UV curing process is between about 30° C. and about 50° C., in some embodiments. The curing process may be performed only one time after the deposition process to reduce the process time, but not limited thereto, in some embodiments. The deposition process and the curing process can be alternately performed. In other embodiments, the flowable isolation dielectric precursor can also be directly transferred into the dielectric layer through an oxidation process by directly introducing nitrogen, oxygen, ozone or steam.

In order to further increase the structural density of the ILD layer, after the curing process, a thermal treatment process may be performed on the isolation dielectric layer. The thermal treatment process includes a steam containing thermal treatment process (wet annealing) and a nitrogen-containing thermal treatment process (dry annealing). A processing temperature range of the steam-containing thermal treatment is between about 400° C. and about 1,000° C., in some embodiments, and the processing temperature of the nitrogen-containing thermal treatment process is between about 1,000° C. and about 1,200° C. In other embodiments, the temperature of thermal treatment can be reduced to about 400° C. by exposing the film to ultra-violet radiation, e.g., in a ultra-violet thermal processing (UVTP) process.

After the curing or treatment, the ILD layer may have a relative permittivity of less than 6, in some embodiments.

In other embodiments, a spin on dielectric (SOD) process is performed to form the ILD layer 145. In this embodiment, the second insulating layer 146, a nitride-containing liner layer, is formed in the prior process to provide a suitable inter layer to the deposited isolation dielectric layer in contact isolation region by SOD process. Therefore, the ILD layer may be formed by yhr SOD process using suitable precursor.

In the SOD process for the ILD layer 145, the precursor may be organosilicon compounds, such as but not limited to siloxane, methylsiloxane, polysilazane and hydrogensilsesquioxane, perhydropolysilazane (PHPS), and other suitable material. The SOD precursor is dissolved in a compatible organic solvent commonly used in coating solutions of spin-on chemicals. Suitable organic solvents include, for example, dibutyl ether (DBE), toluene, xylene, propyleneglycolmonomethyletheracetate (PGMEA), ethyl lactate and isopropyl alcohol (IPA), and the like, preferably use xylene as the solvent for PHPS. The concentration of the SOD precursor in solution can be varied to adjust the consistency (i.e., viscosity) of the solution and thickness of the coating. A solution containing between about 4% to about 30% by weight of SOD precursor can be used, in some embodiments. In other embodiments, a solution containing about 8% to about 20% by weight SOD precursor is used. Additional minor amounts of additives such as surfactants and binders can be included in the solution.

The wafer is spun to uniformly spread SOD precursor from wafer center to edge during precursor spin-on process. The spin speed of cast rotation for SOD precursor coating on substrate is from 100 rpm to 3000 rpm, in some embodiments, for a 12 inch wafer. The dynamic dispense rate of SOD precursor is around 1 ml/sec in some embodiments, and the dispense puddle will spread completely to the edge of the wafer before main speed. The SOD precursor can therefore totally cover the bottom of contact isolation hole and fill the opening 144.

Subsequently, a prebaking process is performed after SOD deposition to stabilize the SOD layer. The prebaking process is performed at low temperature in a range of about 100° C. to about 200° C. in air ambient, in some embodiments. A thermal treatment process is performed after prebaking process to densify the SOD layer. The thermal treatment process is an annealing process performed at high temperature in a range of about 400° C. to about 1100° C., in some embodiments. The annealing process may be a wet annealing process using a gas including steam, $O_2$ and $H_2$ gas or a dry annealing process using a gas including $N_2$ and $O_2$ gas. In the other embodiment, the thermal treatment process uses plasma at a lower temperature in a range of about 150° C. to about 400° C. The partial pressure ratio of water vapor ($H_2O$) to hydrogen ($H_2$) preferably is controlled to a value in a range of about $1 \times 10^{-11}$ to about 1.55.

Figure 6A:
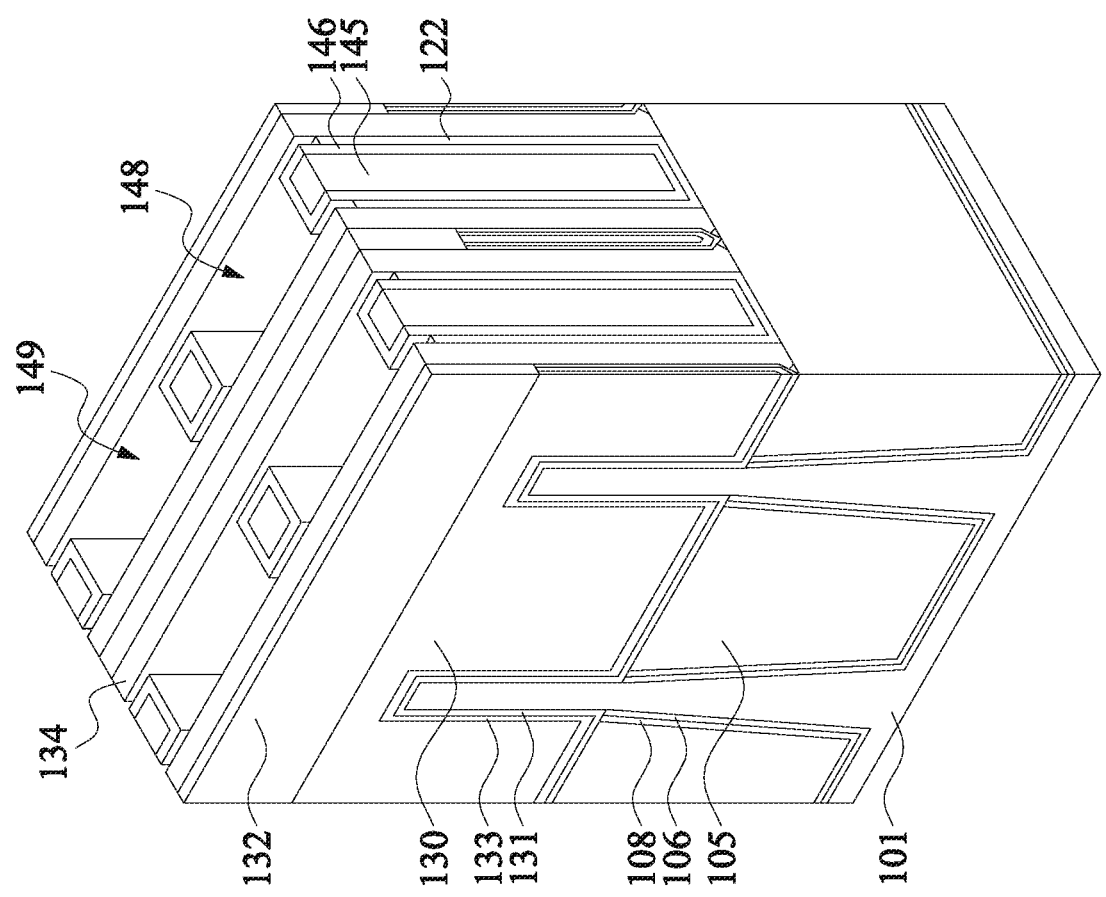
FIGS. 6A, 6B, 6C and 6D illustrate one of the various process stages in a semiconductor device fabrication process according to some embodiments of the present disclosure.
Figure 6C:
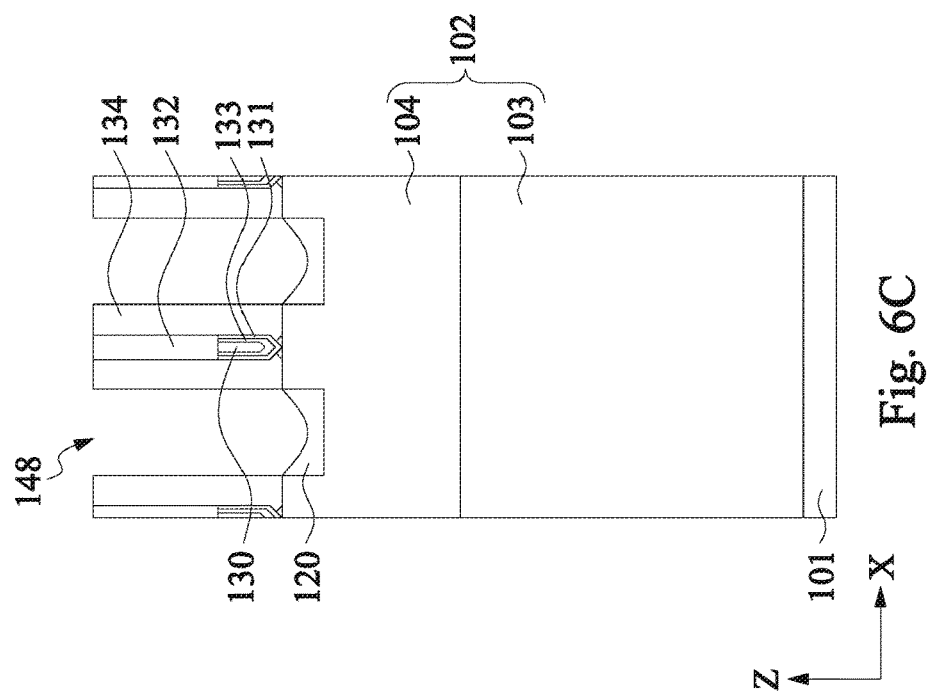
Figure 6B:
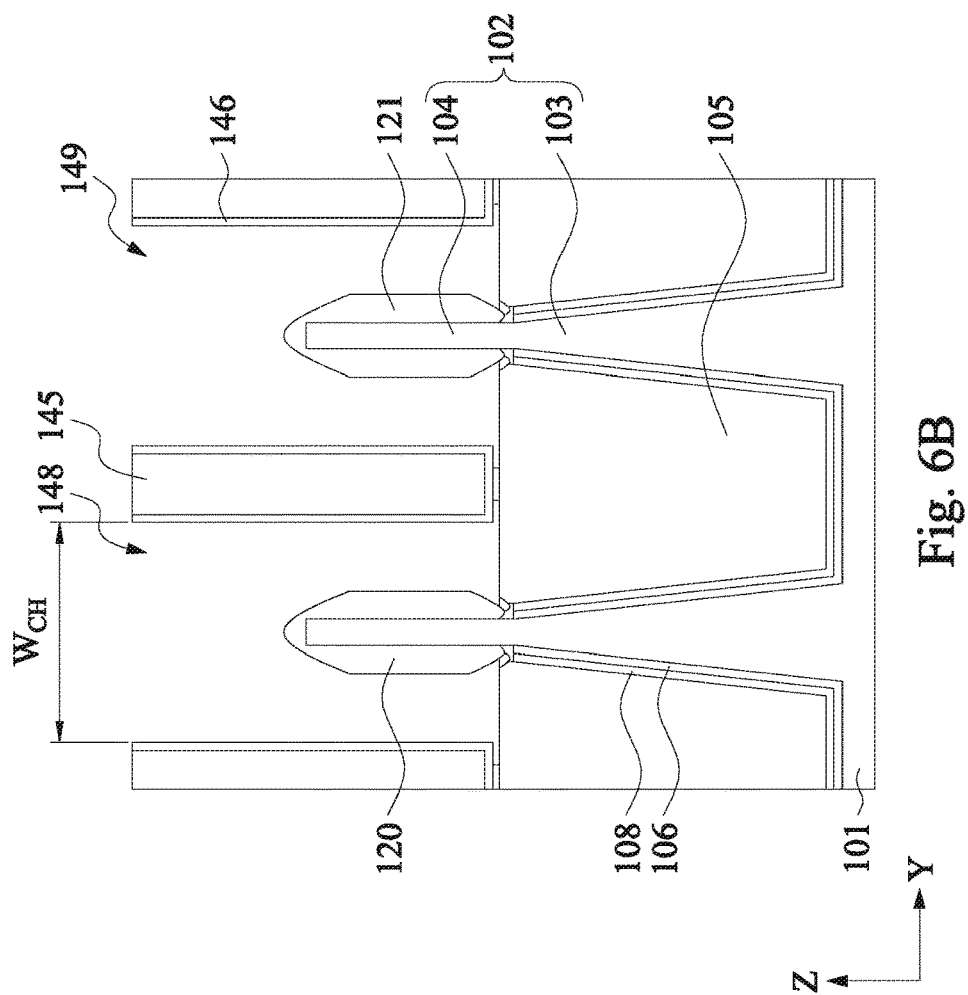
Figure 6D:
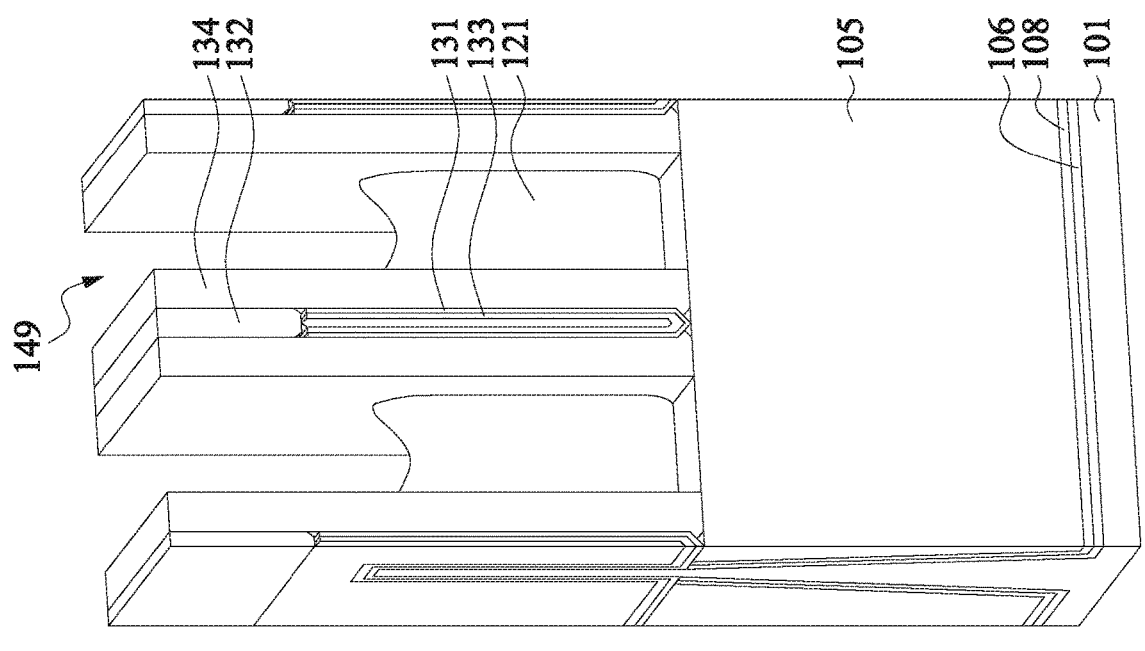
Figure 6D:
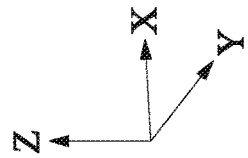

FIGS. 6A-6D show exemplary views of one of the various stages for manufacturing a FinFET device according to some embodiments of the present disclosure. FIG. 6D shows an exemplary perspective view around the S/D structure 121.

Subsequently, the second sacrificial layer 140 is removed, thereby forming contact openings 148 and 149 to expose the S/D structures 120, 121 covered by the first insulating layer 122. The etching operation to remove the second sacrificial layer 140 may be isotropic or anisotropic. In addition, the first insulating layer 122 is removed, thereby exposing the S/D structures 120, 121.

When a Si based material (e.g., poly-Si or amorphous Si) is used as the second sacrificial layer 140, the etching can be performed by plasma dry etching using a gas including $Cl_2$ and $NF_3$ or a gas including $F_2$, or wet etching using $NH_4OH$ and/or tetramethylammonium (TMAH). When SOC (spin-on-carbon) is used as the second sacrificial layer 140, the etching can be performed by plasma dry etching using, for example, a gas including $N_2$ and $H_2$ or a gas including $SO_2$ and $O_2$. When a Si oxide based material formed by FCVD is used as the second sacrificial layer, the etching can be performed by wet etching using, for example, HF or buffered HF (BHF).

When a Ge based material (e.g., Ge or SiGe) is used as the second sacrificial layer 140, the etching can be performed by plasma dry etching using, for example, ozone, or wet etching using a solution containing $NH_4OH$ and $H_2O_2$ or a solution containing HCl and $H_2O_2$.

The remaining first insulating layer 122 can be removed by using a suitable etching operation. In some embodiments, during the etching of the first insulating layer 122, the second insulating layer 146 is also etched when the second insulating layer 146 is made of the same or similar material as the second insulating layer 122. In certain embodiments, the second insulating layer 146 is fully removed from the wall of the contact openings 148 and 149. However, even in such a case, the second insulating layer 146 remains at the bottom of the ILD layer 145 in some embodiments.

Since the etching rate for the second sacrificial layer 140 is higher than other materials, it is possible to remove the second sacrificial layer 140 without causing damage in the other layers, for example, the gate cap layer 132, the sidewall spacers 134, the first insulating layer 122, the ILD layer 145 and/or the second insulating layer 146.

The width $W_{CH}$ along the Y direction of the openings 148, 149 is in a range from about 10 nm to about 100 nm in some embodiments. In other embodiments, the width $W_{CH}$ is in a range from about 15 nm to about 50 nm.

Figure 7A:
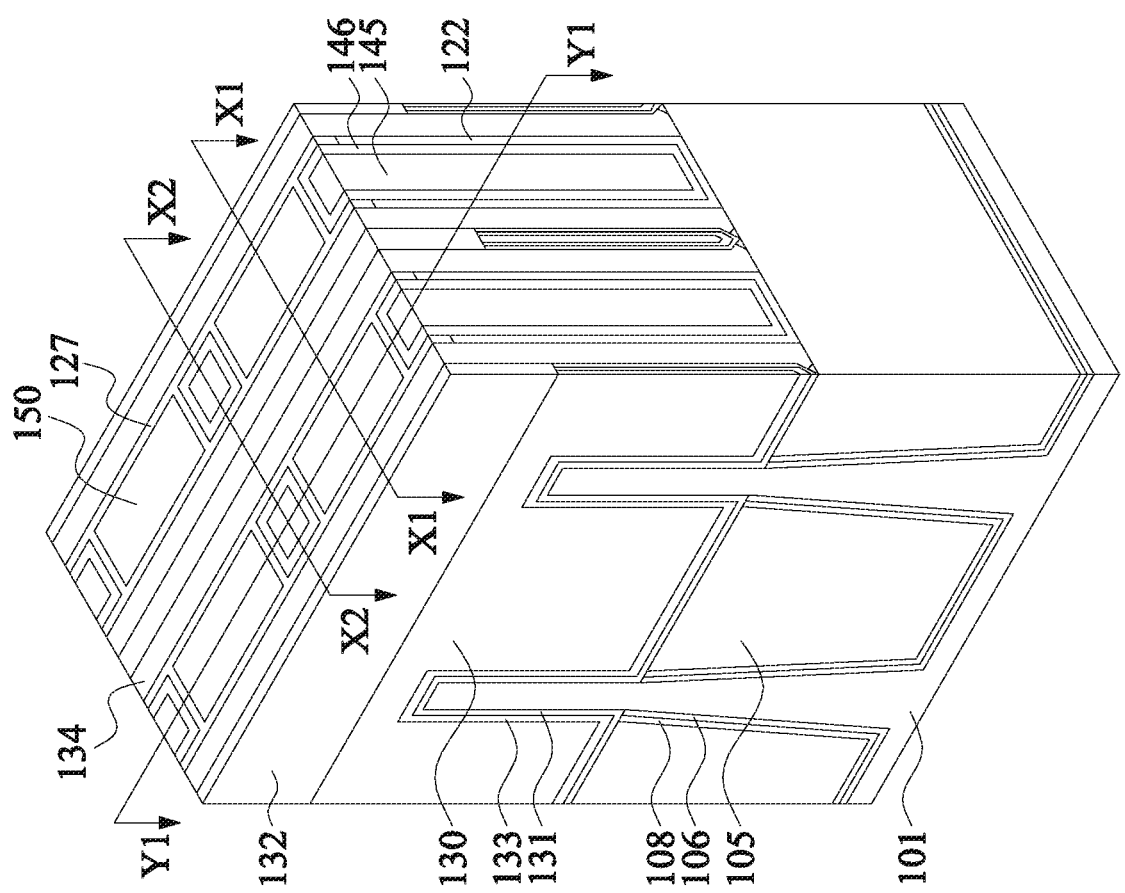
FIGS. 7A, 7B and 7C illustrate one of the various process stages in a semiconductor device fabrication process according to some embodiments of the present disclosure.
Figure 7C:
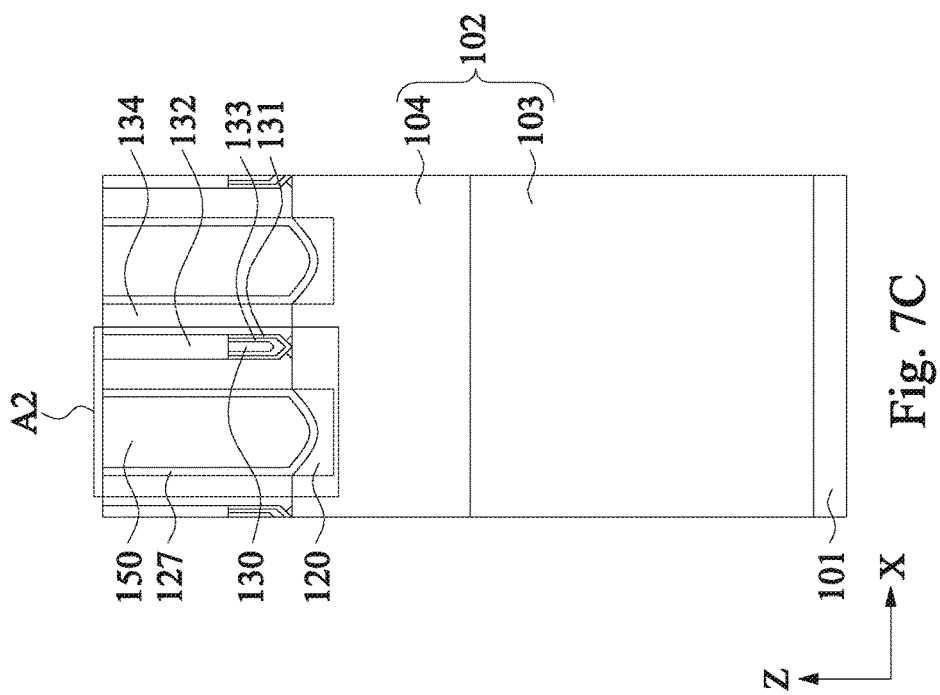
Figure 7B:
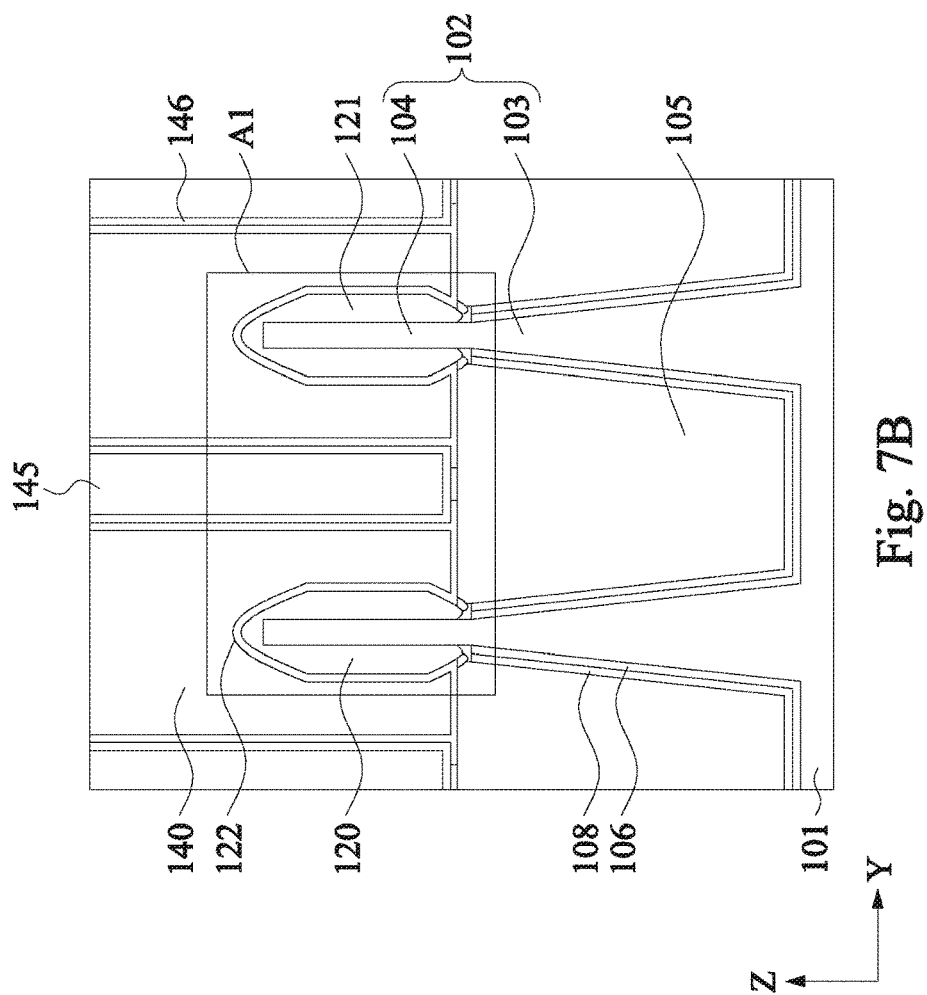

FIGS. 7A-7C show exemplary views of one of the various stages for manufacturing a FinFET device according to some embodiments of the present disclosure.

After the second sacrificial layer and the first insulating layer 122 formed on the S/D structures 120, 121 are removed, a conductive material is filled in the contact openings 148, 149, thereby forming S/D contacts 150.

In some embodiments, a silicide layer 127 is formed on the exposed S/D structures 120, 121. The metal silicide formation process may form a metal silicide on the side portions of the S/D structures. The metal silicide formation process includes a metal film deposition on the S/D structures, a thermal treatment to form a metal silicide at the interface or surface of the S/D structures, and an etching process to remove the excess unreacted metal. The metal silicide comprises $TiSi_x$, $NiSi_x$, $CoSi_x$, $NiCoSi_x$, and $TaSi_x$, but other suitable silicide materials may be used. In some embodiments, the silicide layer has a thickness between about 0.5 nm and about 10 nm. In other embodiments, a silicide layer is not formed at this stage of the manufacturing operations, and may be formed at an earlier manufacturing stage, e.g., before forming the first insulating layer 122. In some embodiments, a metal film is also formed on the second insulating layer 146 and the isolation insulating layer 105. The metal films not formed on the S/D epitaxial layer and the metal films not consumed to form the silicide layer are removed by a suitable etching operation in some embodiments. In other embodiments, the metal films are not removed and remain.

The S/D contacts 150 may include a single layer or a multi-layer structure. For example, in some embodiments, the contact 150 includes a contact liner layer, such as a diffusion barrier layer, an adhesion layer, or the like, and a contact body formed over the contact liner layer in the contact openings 148, 149. The contact liner layer may include Ti, TiN, Ta, TaN, or the like formed by ALD, CVD, or the like. The contact body may be formed by depositing a conductive material, such as one or more layers of Ni, Ta, TaN, W, Co, Ti, TiN, Al, Cu, Au, alloys thereof, combinations thereof, or the like, but other suitable metals may also be used. A planarization process, such as a CMP, may be performed to remove excess material from a surface of the ILD layer 145.

After the S/D contact 150 is formed, the height $H_g$ of the gate structure including the gate cap layer 132 measured from the top of the fin structure 104 (see, FIG. 20A) is in a range from about 20 nm to 100 nm and the height $H_{mg}$ of the metal gate 130 measured from the top of the fin structure 104 (see, FIG. 20A) is in a range from about 10 nm to about 60 nm in some embodiments.

After the contact 150, further CMOS processes are performed to form various features such as additional interlayer dielectric layers, contacts/vias, interconnect metal layers, and passivation layers, etc.

FIGS. 8A-16C illustrate various processes in a semiconductor device fabrication process in accordance with other embodiments of the present disclosure.

Throughout the various views and illustrative embodiments, like reference numbers are used to designate like elements. In FIGS. 8A-16C, the "A" figures (e.g., FIGS. 8A, 9A, etc.) illustrate a perspective view, the "B" figures (e.g., FIGS. 8B, 9B, etc.) illustrate a cross-sectional view along the Y direction corresponding to line Y1-Y1 illustrated in FIGS. 8A and 9A, and the "C" figures (e.g., FIG. 8C, 8C, etc.) illustrate a cross-sectional view along the X direction corresponding to line X1-X1 illustrated in FIGS. 8A and 9A. It is understood that additional operations can be provided before, during, and after processes shown by FIGS. 8A-16C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-7C may be employed in the following embodiments, and detailed explanation thereof may be omitted.

Figure 8A:
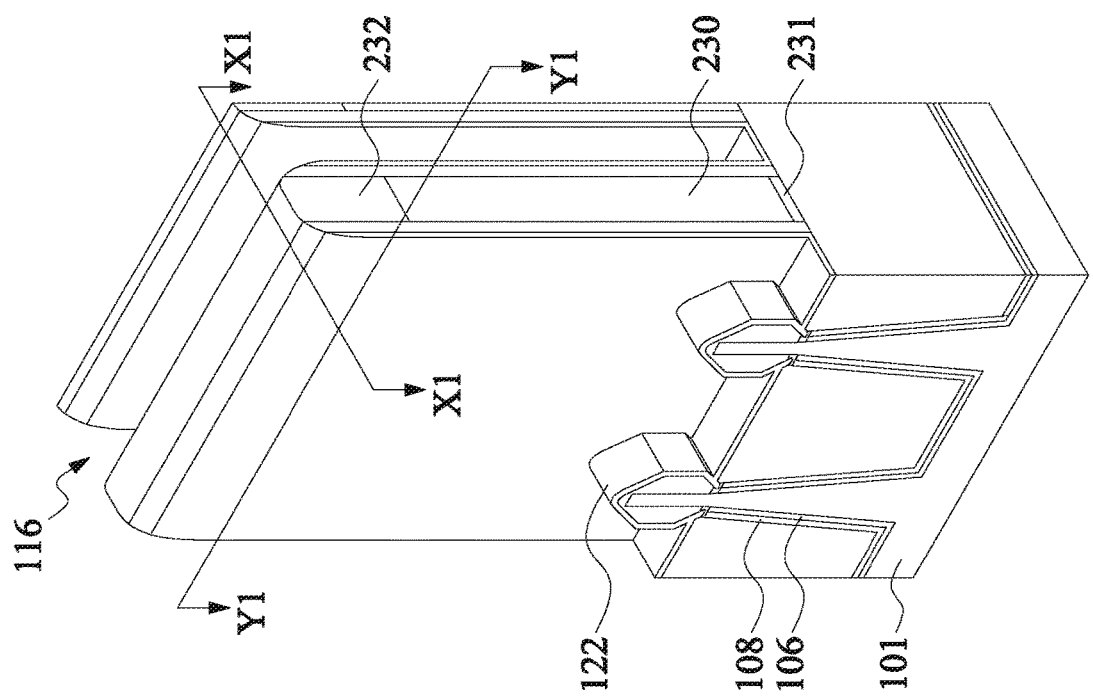
FIGS. 8A, 8B and 8C illustrate one of the various process stages in a semiconductor device fabrication process according to other embodiments of the present disclosure.
Figure 8C:
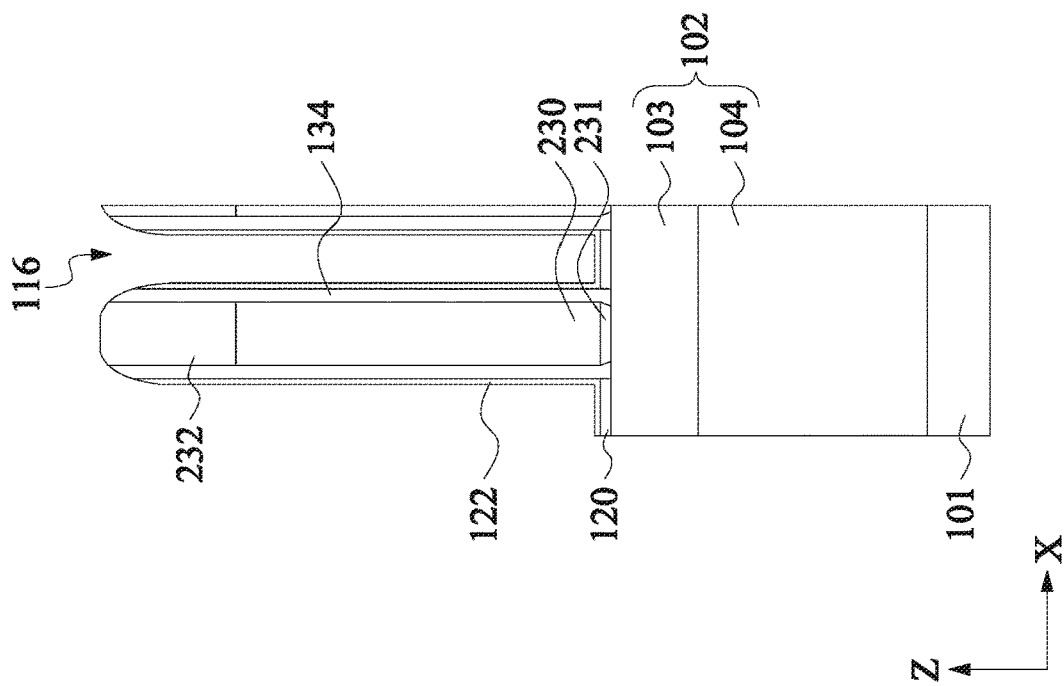
Figure 8B:
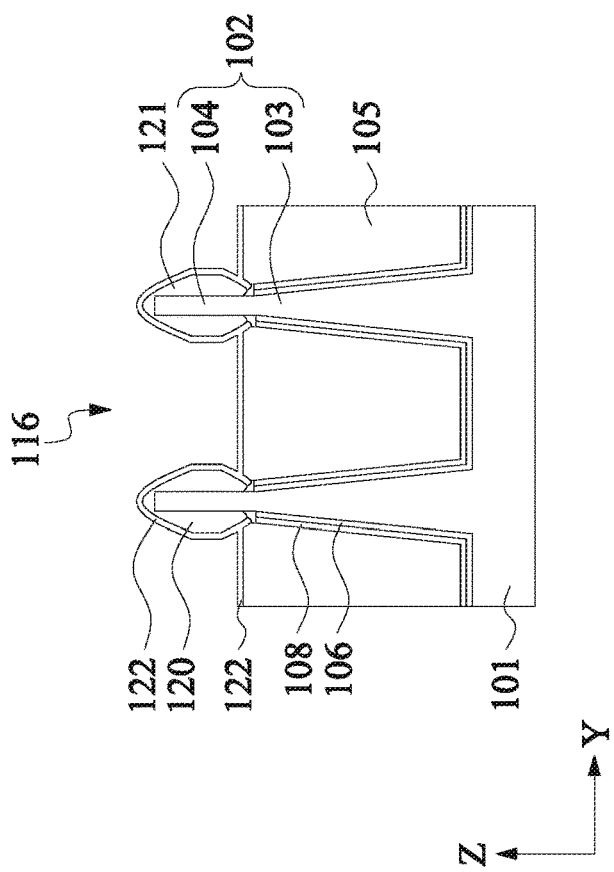

FIGS. 8A-8C show exemplary views of one of the various stages for manufacturing a FinFET device according to some embodiments of the present disclosure.

The structure shown in FIGS. 8A-8C is substantially similar to the structure shown in FIGS. 2A-2C, except that the gate structure has not been formed and a dummy gate electrode 230, a dummy gate dielectric layer 231 and a gate mask layer 232 are disposed on the substrate instead of the gate electrode 130, the gate dielectric layer 131 and gate cap layer 132. The operations to fabricate the dummy gate structures are as set forth above.

Figure 9A:
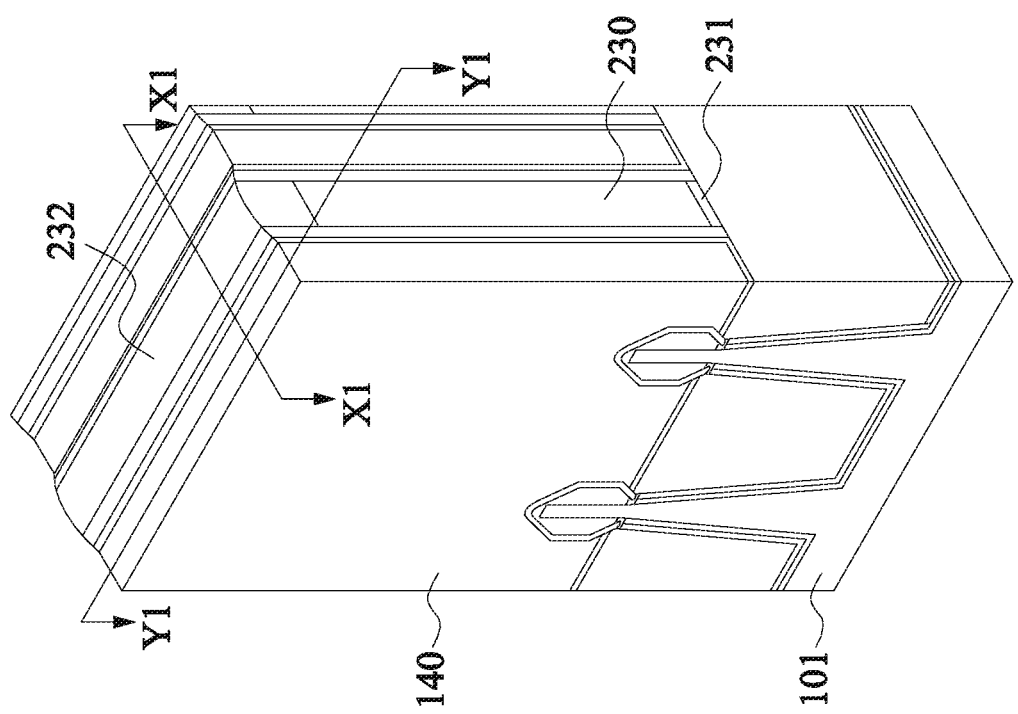

FIGS. 9A-9C show exemplary views of one of the various stages for manufacturing a FinFET device according to some embodiments of the present disclosure.

Similar to FIGS. 3A-3C, a second sacrificial layer 140 is formed in the openings 116.

Figure 10A:
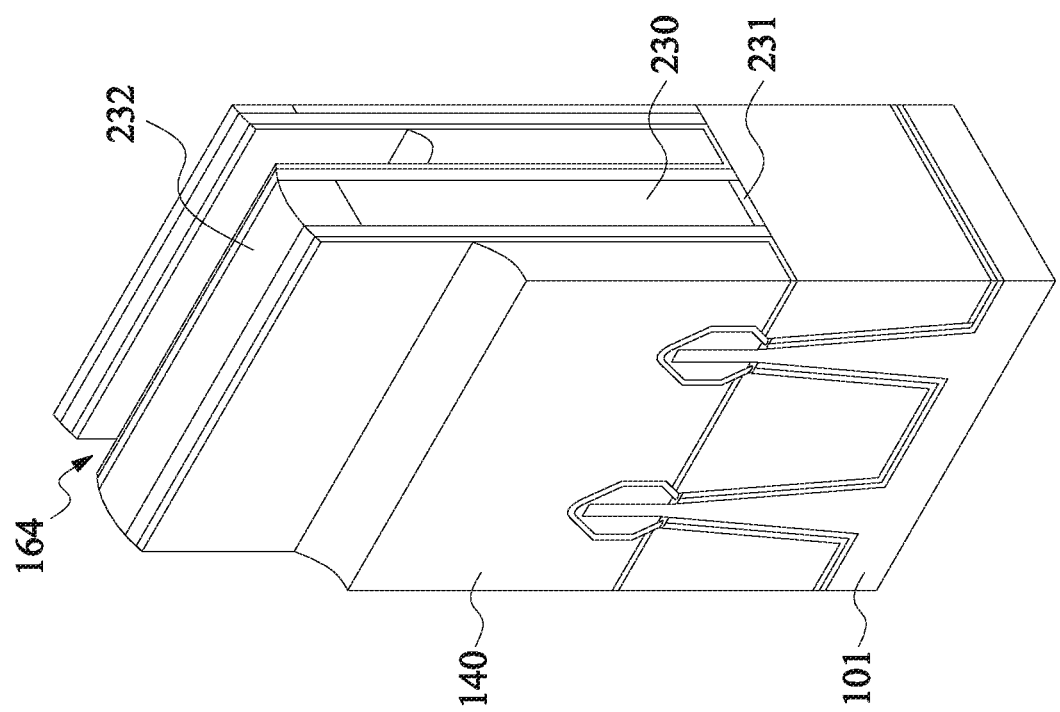
FIGS. 10A, 10B and 10C illustrate one of the various process stages in a semiconductor device fabrication process according to other embodiments of the present disclosure.
Figure 10C:
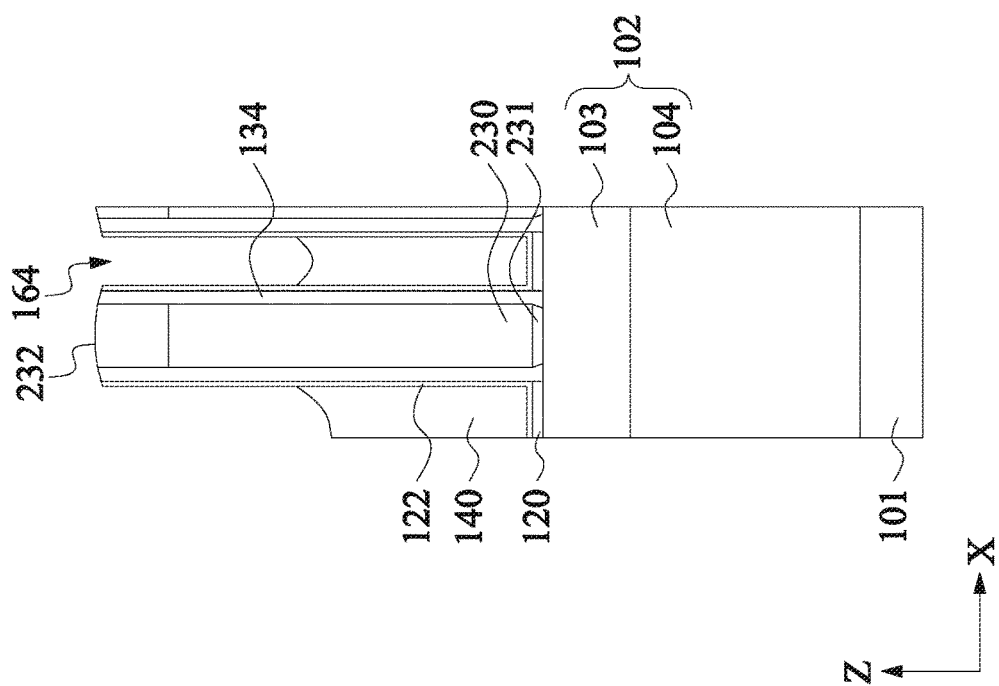
Figure 10B:
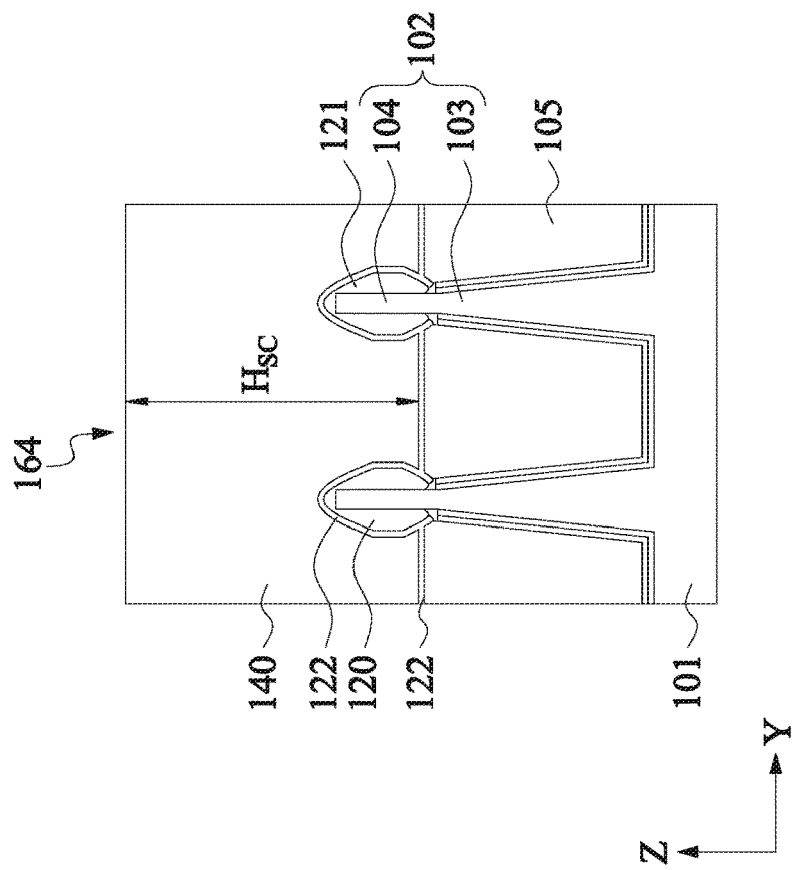

FIGS. 10A-10C show exemplary views of one of the various stages for manufacturing a FinFET device according to some embodiments of the present disclosure.

Subsequently, the second sacrificial layer 140 is partially recessed to a level of the middle portion of the dummy gate electrode 122 in the Z direction, thereby forming openings 164. The second sacrificial layer 140 can be recessed by an etch-back process and/or wet etching. The remaining thickness $H_{sc}$ of the recessed second sacrificial layer 140 is in a range from about 40 nm to about 200 nm in some embodiments.

Figure 11A:
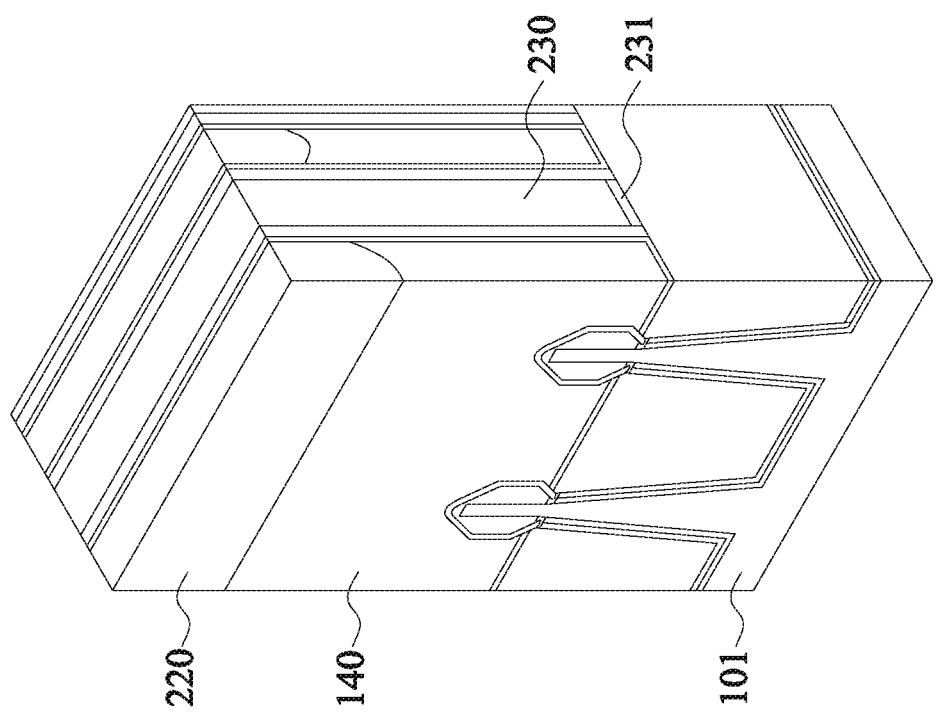
FIGS. 11A, 11B and 11C illustrate one of the various process stages in a semiconductor device fabrication process according to other embodiments of the present disclosure.
Figure 11C:
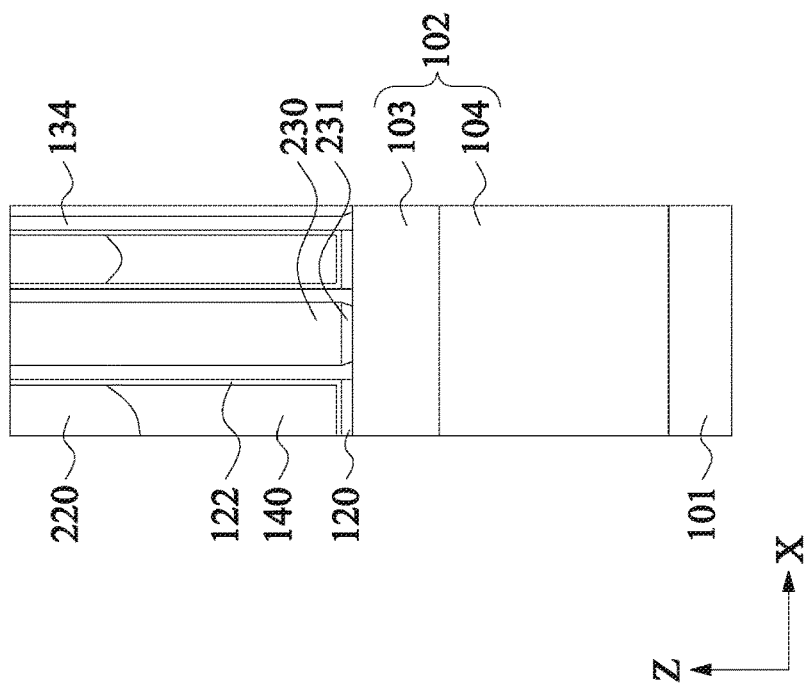
Figure 11B:
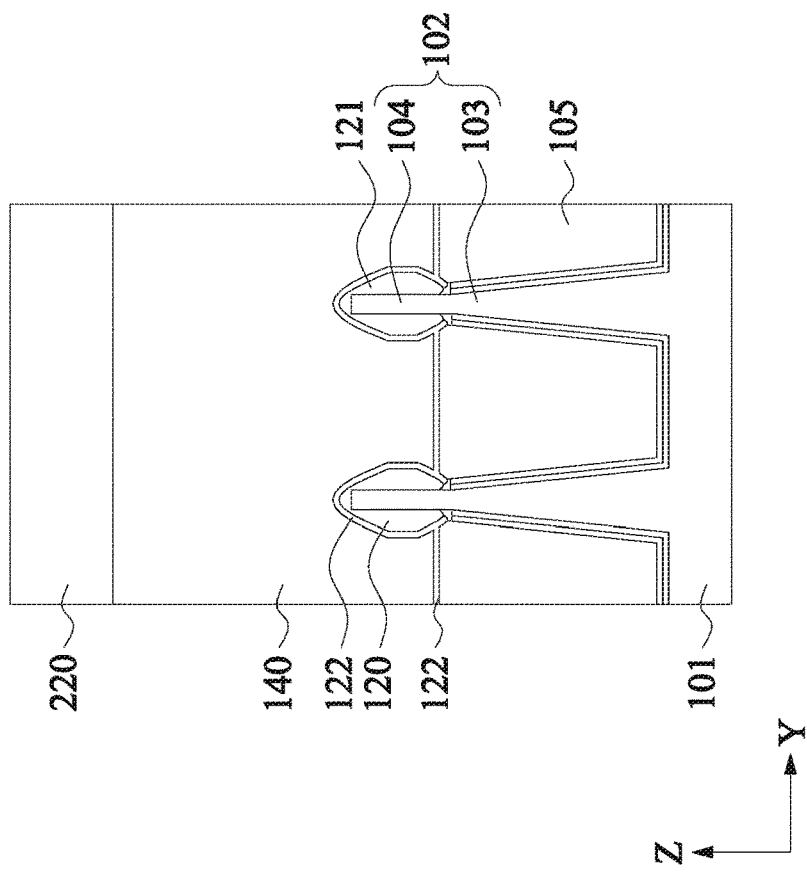

FIGS. 11A-11C show exemplary views of one of the various stages for manufacturing a FinFET device according to some embodiments of the present disclosure.

The openings 164 are filled with an insulating material, thereby forming a mask layer 220. In some embodiments, the mask layer 220 is made of one or more layers of SiOC, SiC, SiON, SiCN, SiOCN, SiN and/or $SiO_2$. In one embodiment, SiN is used. The mask layer 220 may be deposited through one or more processes such as PVD, CVD, or ALD, although any acceptable process may be utilized. Other materials and/or processes may be used. A planarization operation, such as, an etch-back process or CMP, may be performed to planarize the upper surface of the mask layer and gate mask layer 232. By the planarization operation, the upper surface of the dummy gate electrode layer 230 is exposed.

Figure 12A:
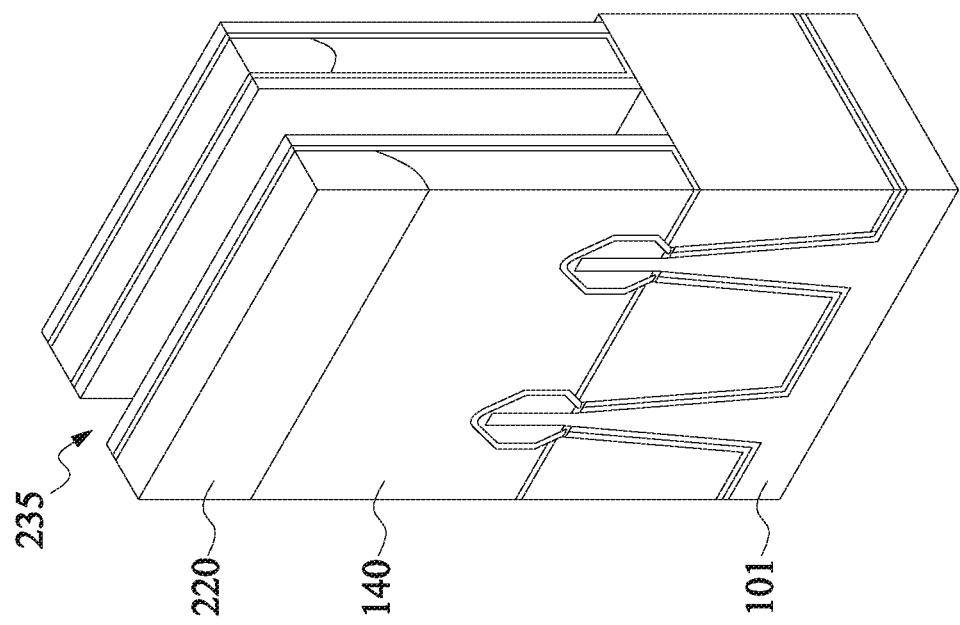

FIGS. 12A-12C show exemplary views of one of the various stages for manufacturing a FinFET device according to some embodiments of the present disclosure.

Subsequently, the dummy gate electrode 230 and the dummy gate dielectric layer 231 are removed, thereby forming an opening 235. The removal operations are explained above with respect to FIGS. 1A-1C.

Figure 13A:
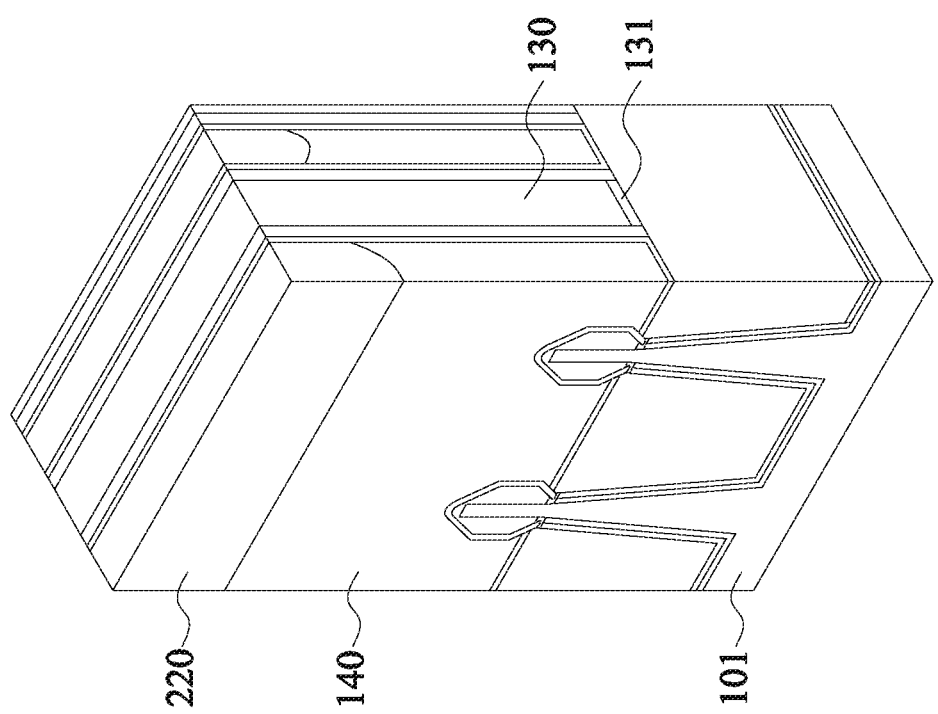
FIGS. 13A, 13B and 13C illustrate one of the various process stages in a semiconductor device fabrication process according to other embodiments of the present disclosure.
Figure 13C:
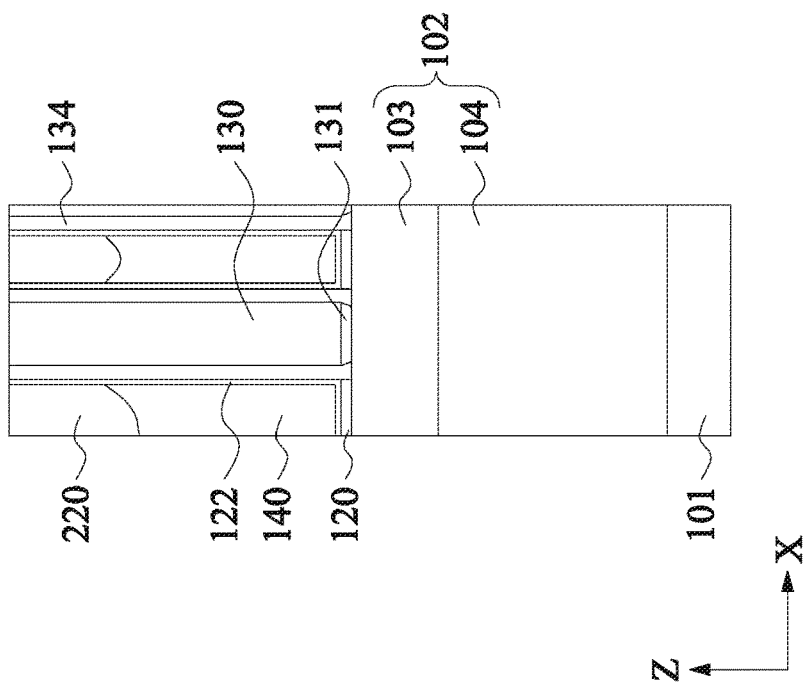
Figure 13B:
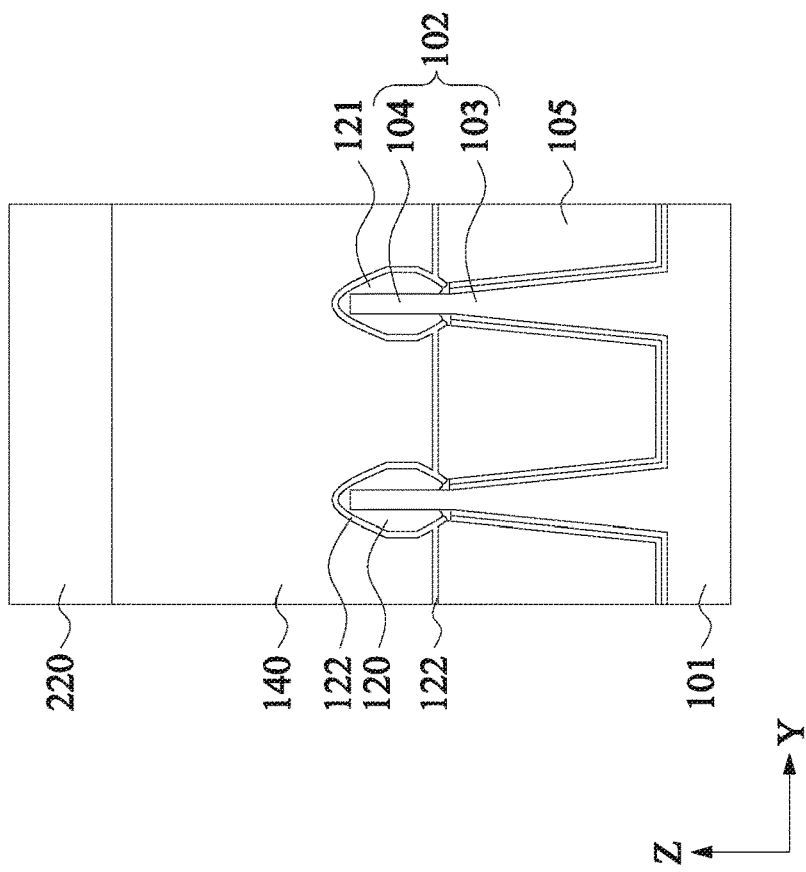

FIGS. 13A-13C show exemplary views of one of the various stages for manufacturing a FinFET device according to some embodiments of the present disclosure.

After the dummy gate structure is removed, a gate dielectric layer 131 is formed over a channel region of the fin structure 104, and a conductive layer for a gate electrode 130 is formed on the gate dielectric layer 131. The gate formation operations are explained above with respect to FIGS. 1A-1C.

The gate electrode 130 may be formed using a suitable process such as ALD, CVD, PVD, plating, or combinations thereof. A planarization process, such as a CMP, may be performed to remove excess materials. After the planarization operation the mask layer 220 is exposed.

Figure 14A:
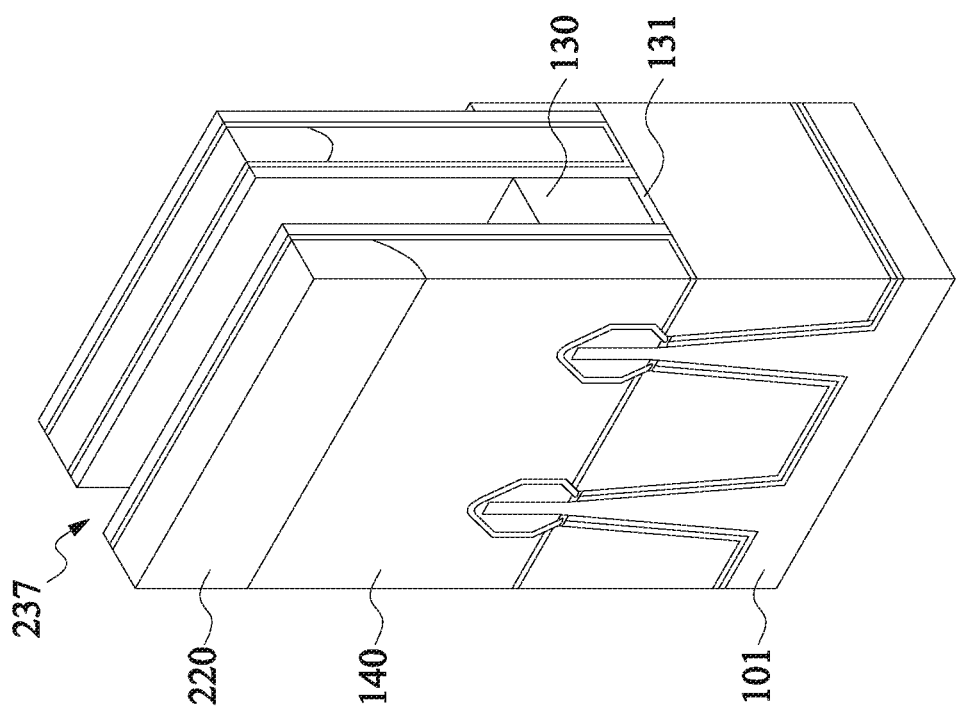
FIGS. 14A, 14B and 14C illustrate one of the various process stages in a semiconductor device fabrication process according to other embodiments of the present disclosure.
Figure 14C:
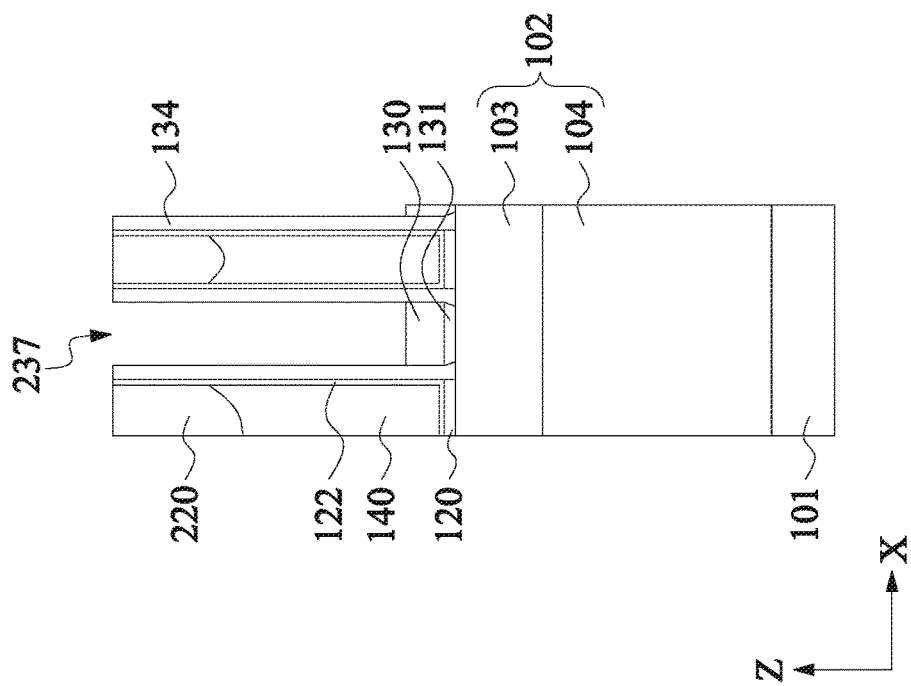
Figure 14B:
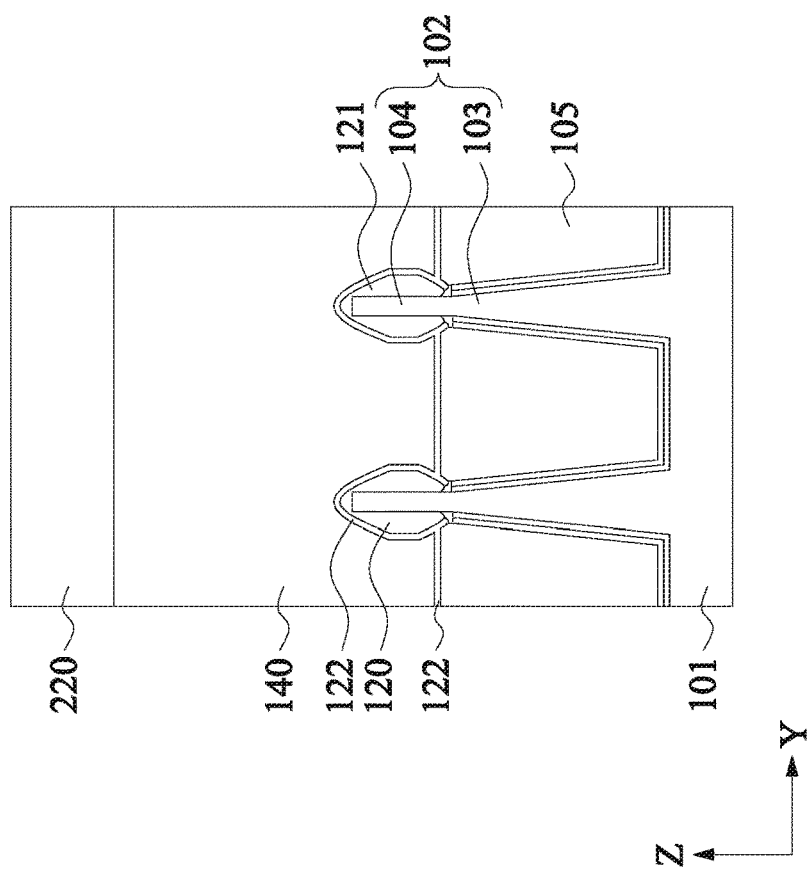

FIGS. 14A-14C show exemplary views of one of the various stages for manufacturing a FinFET device according to some embodiments of the present disclosure.

Subsequently, the gate electrode layer is recessed, thereby forming the gate electrode 130 and a gate cap opening 237.

Figure 15A:
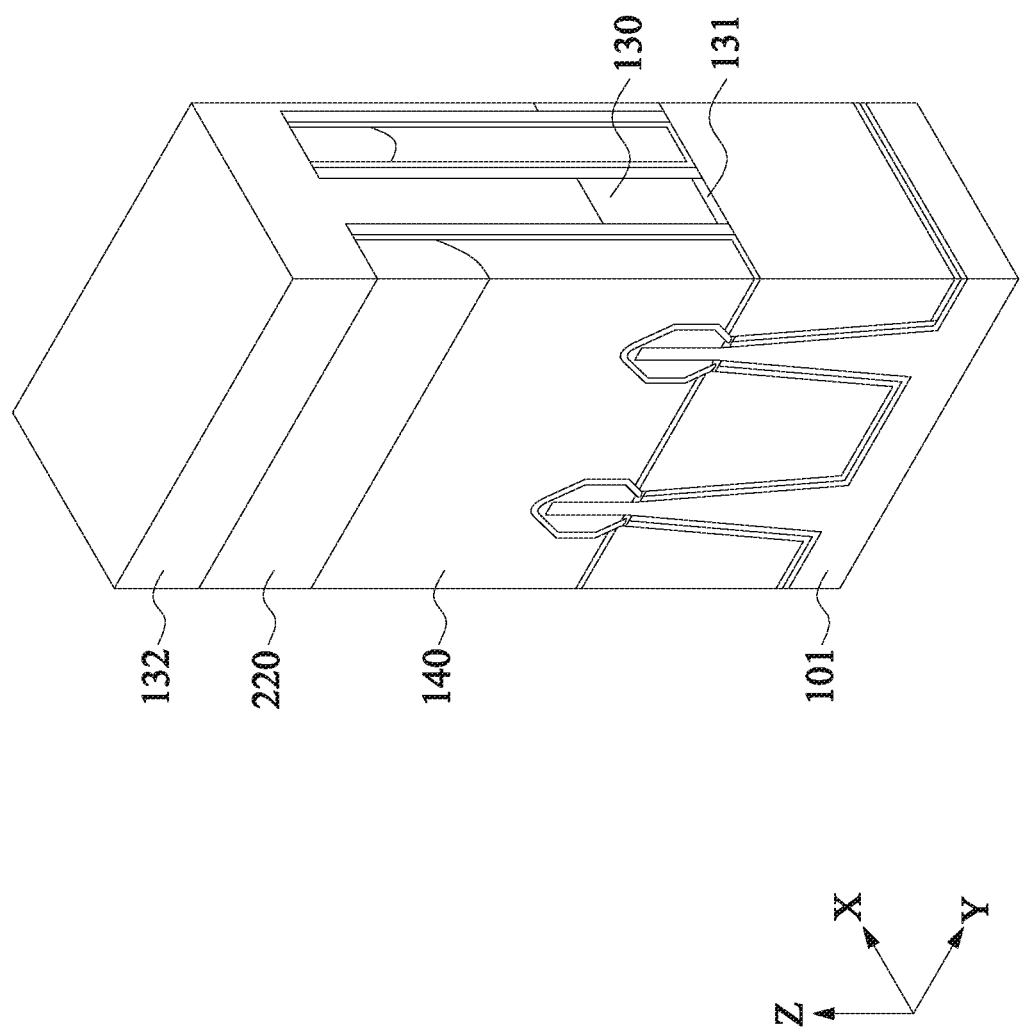
FIGS. 15A, 15B and 15C illustrate one of the various process stages in a semiconductor device fabrication process according to other embodiments of the present disclosure.
Figure 15C:
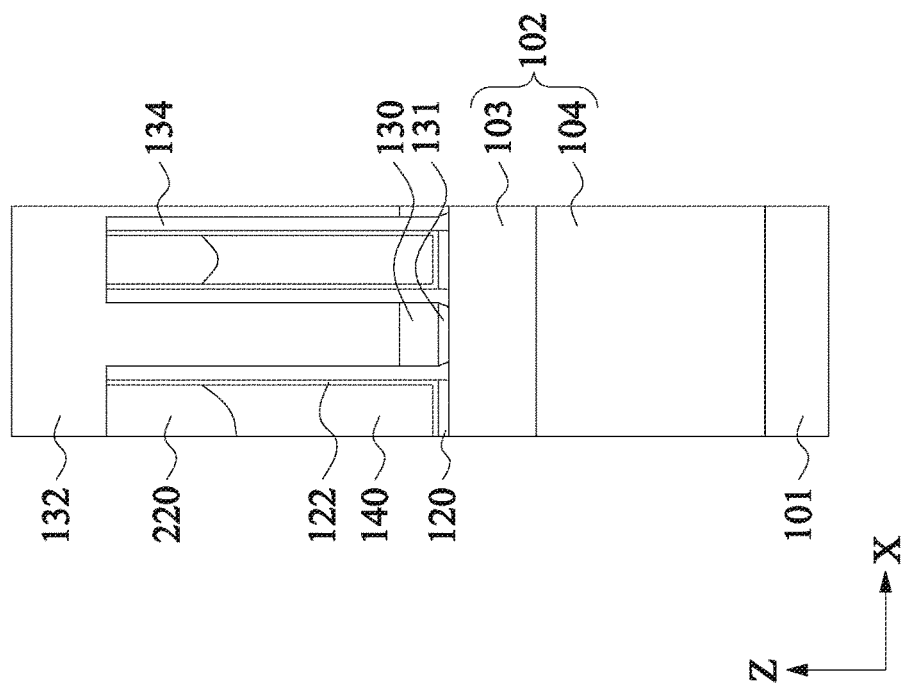
Figure 15B:
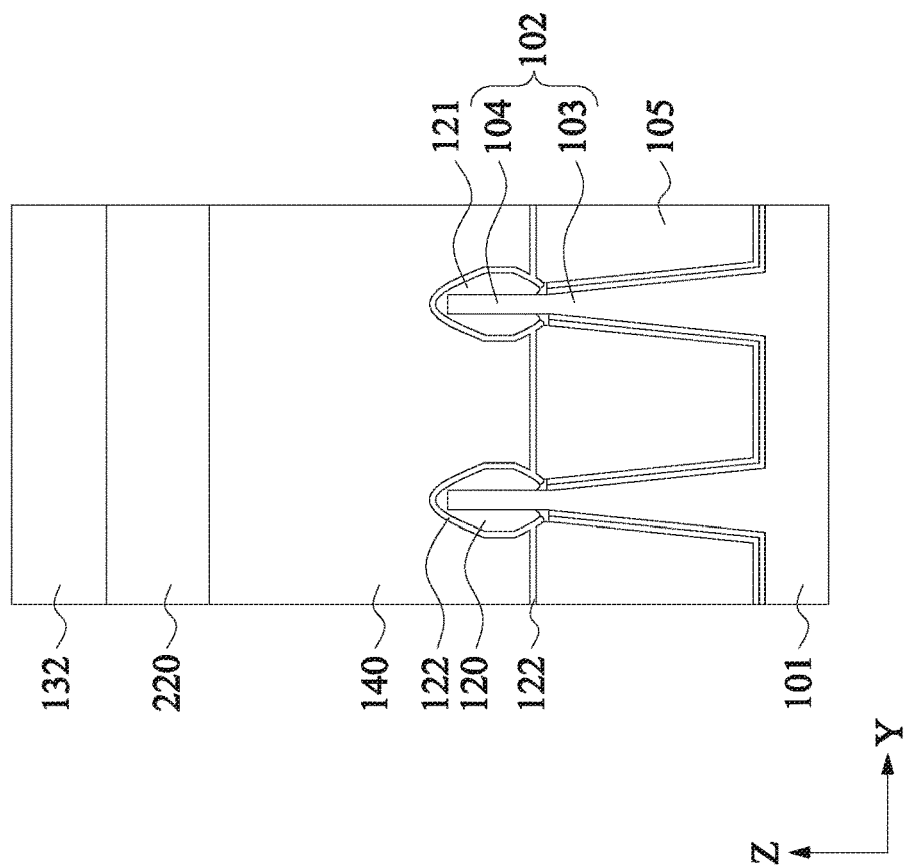

FIGS. 15A-15C show exemplary views of one of the various stages for manufacturing a FinFET device according to some embodiments of the present disclosure.

Then, an insulating layer 132 is formed in the gate cap opening 237 and over the mask layer 220. In some embodiments, the insulating layer for the gate cap layer 132 includes $SiO_2$, SiCN, SiON, SiN, $Al_2O_3$, $La_2O_3$, a combination thereof, or the like, but other suitable dielectric films may be used. The insulating layer for the gate cap layer 132 may be formed using, for example, CVD, PVD, spin-on, or the like. Other suitable process steps may be used.

Figure 16A:
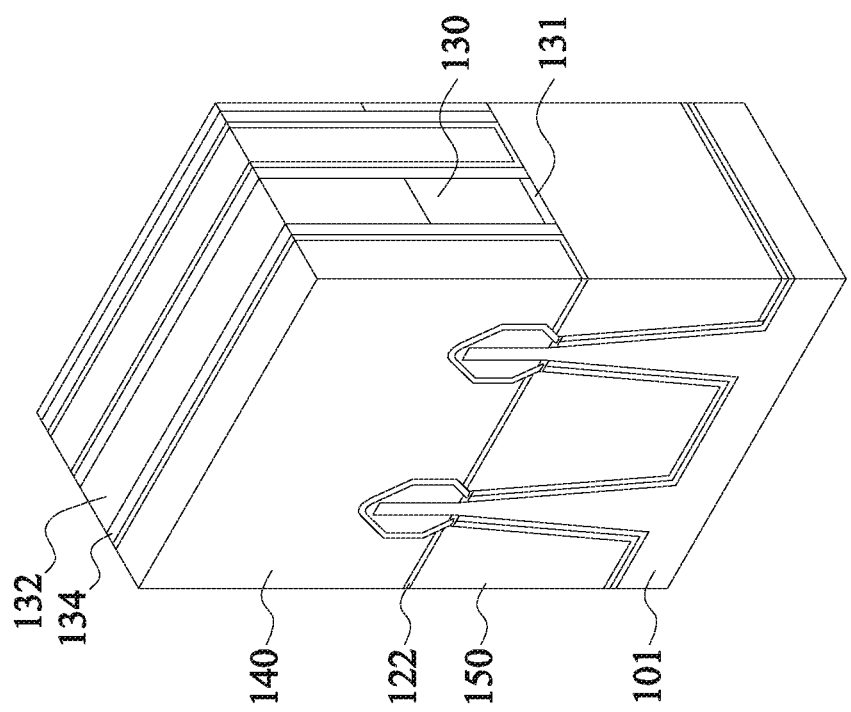
FIGS. 16A, 16B and 16C illustrate one of the various process stages in a semiconductor device fabrication process according to other embodiments of the present disclosure.
Figure 16C:
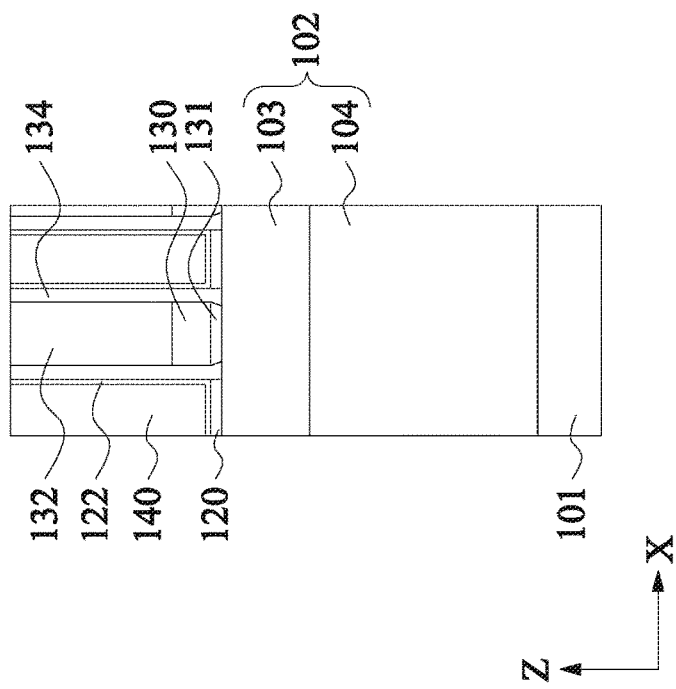
Figure 16B:
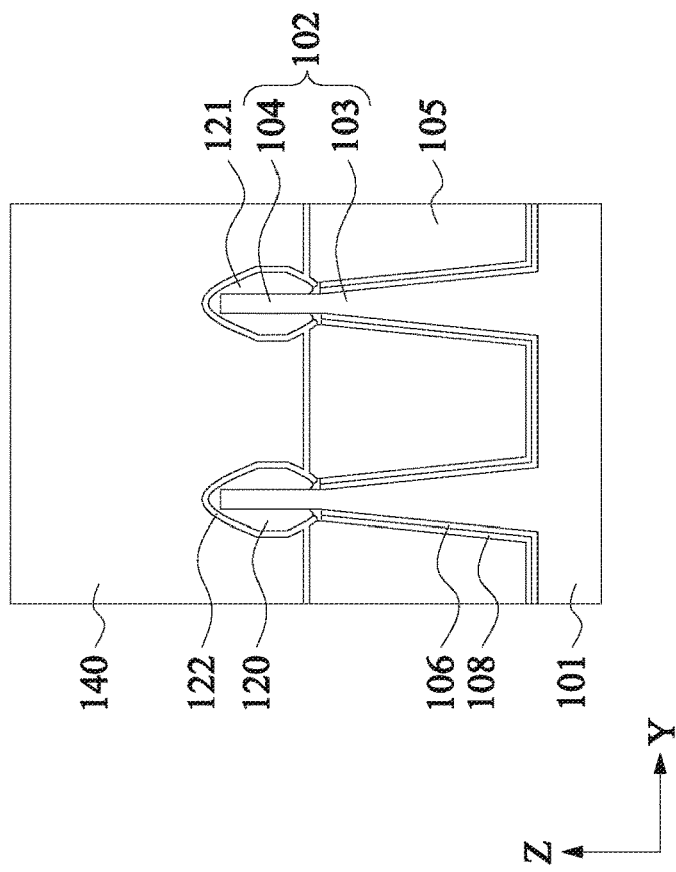

FIGS. 16A-16C show exemplary views of one of the various stages for manufacturing a FinFET device according to some embodiments of the present disclosure.

Subsequently, a planarization process, such as a CMP, may be performed to remove excess insulating material and the mask layer 220, thereby forming the gate cap layer 132. The structure of FIGS. 16A-16C is substantially the same as the structure of FIGS. 3A-3C. Subsequently, the same operations as explained with FIGS. 4A-7C are performed.

Figure 17A:
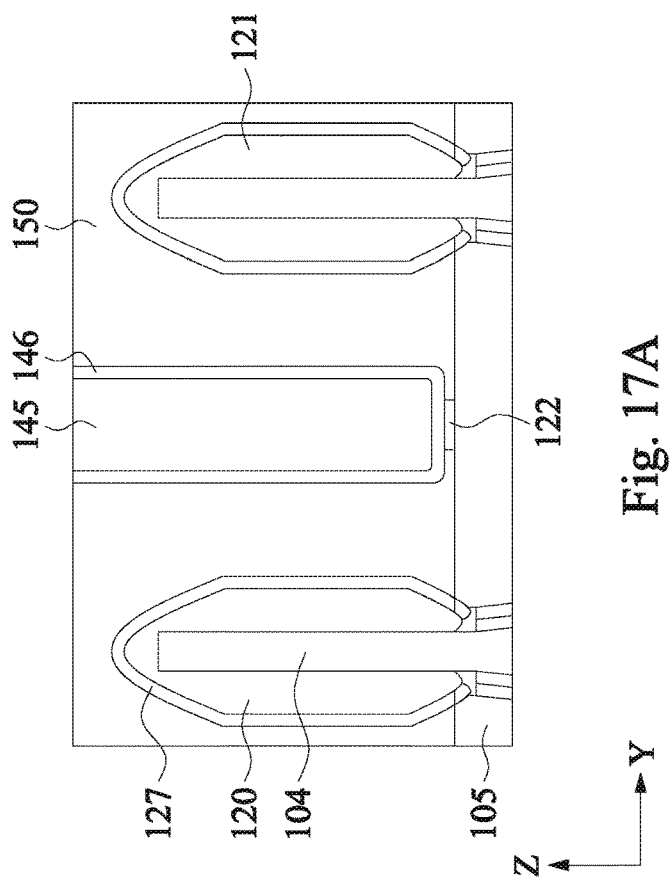
FIGS. 17A and 17B illustrate exemplary cross sectional views of a semiconductor device in accordance with some embodiments of the present disclosure.
Figure 17B:
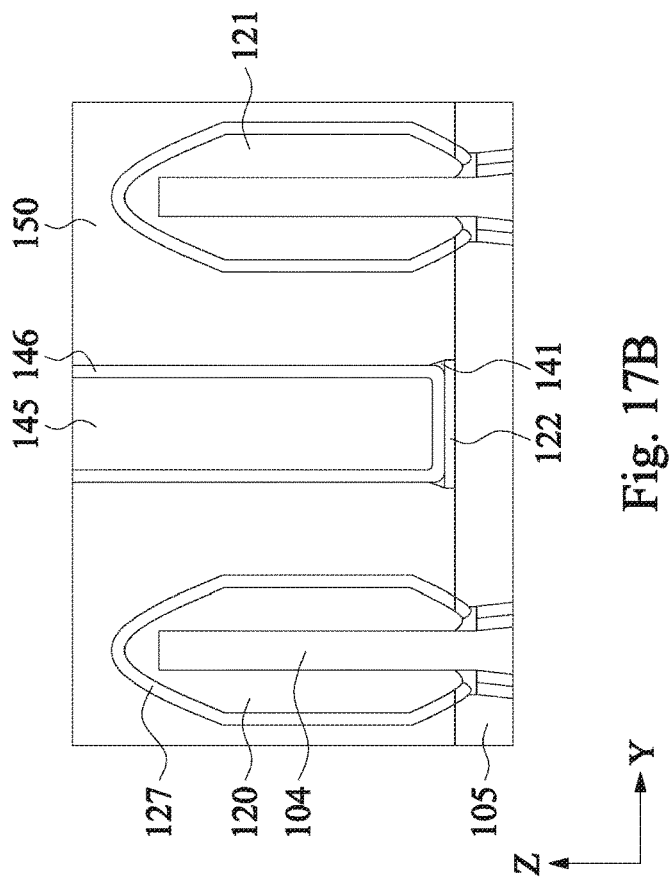

FIGS. 17A and 17B illustrate exemplary cross sectional views corresponding to the line X2-X2 of FIG. 7A and corresponding to the area A1 of FIG. 7B.

As shown in FIG. 17A, in some embodiments of the present disclosure, the second insulating layer 146 is interposed between the contact 150 made of conductive material and the ILD 145. In addition, the first insulating layer 122 is interposed between the second insulating layer 146 and the isolation insulating layer 105, in some embodiments. The conductive material 150 partially penetrates into a space between the bottom of the second insulating layer 146 and the surface of the isolation insulating layer 105. In some embodiments, the first insulating layer, the second insulating layer and the isolation insulating layer are made of different dielectric material from each other.

Further, the conductive material of the contact 150 is directly disposed on the isolation insulating layer 105, without interposing another dielectric layer, in some embodiments.

As shown in FIG. 17B, in some embodiments of the present disclosure, a residual piece 141 of the second sacrificial layer 140 (e.g., amorphous Si or poly Si) remains at the bottom of the second insulating layer 146, and/or between the second insulating layer 146 and the first insulating layer 122.

Figure 18:
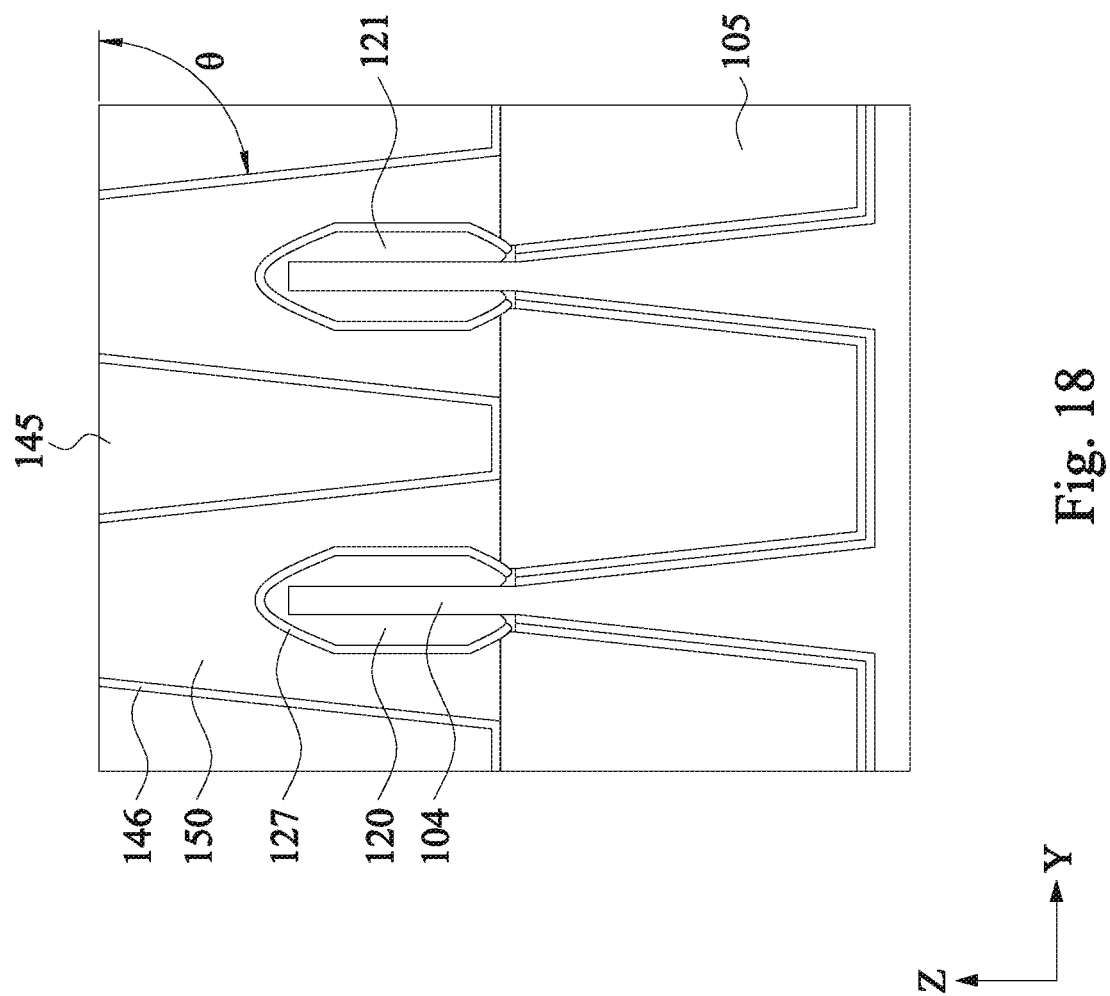
FIG. 18 illustrates an exemplary cross sectional view of a semiconductor device in accordance with some embodiments of the present disclosure.

FIG. 18 illustrates an exemplary cross sectional view of a semiconductor device in accordance with some embodiments of the present disclosure.

Due to the etching properties of the second sacrificial layer etching, the opening 144 has a tapered shape having an upper width larger than a bottom width in some embodiments. Accordingly, the openings 148 and 149 have a reverse tapered shape having a upper width smaller than a bottom width, therefore the S/D contact 150 also has a reverse tapered shape, as shown in FIG. 18. The angle θ formed by the upper surface of the ILD layer 145 and the side of the contact 150 near the top is smaller than 90 degrees. In some embodiments, 60 degrees<θ<85 degree.

Figure 19B:
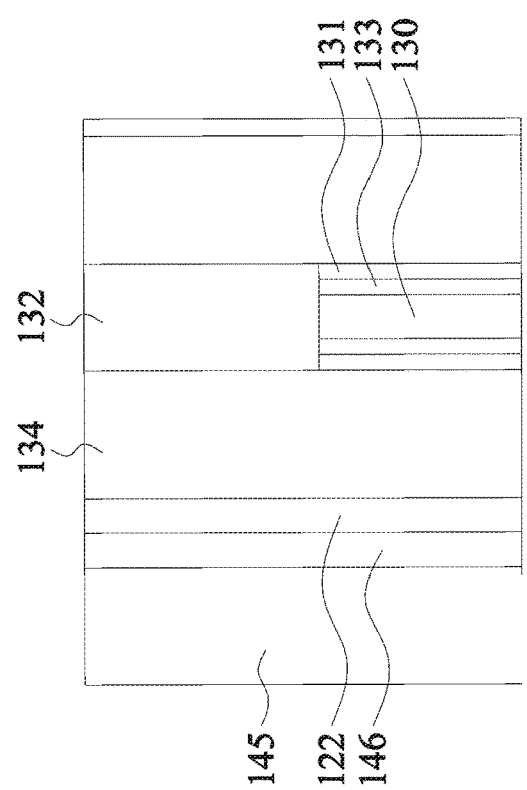
FIGS. 19A and 19B illustrate exemplary cross sectional views of a semiconductor device in accordance with some embodiments of the present disclosure.
Figure 19A:
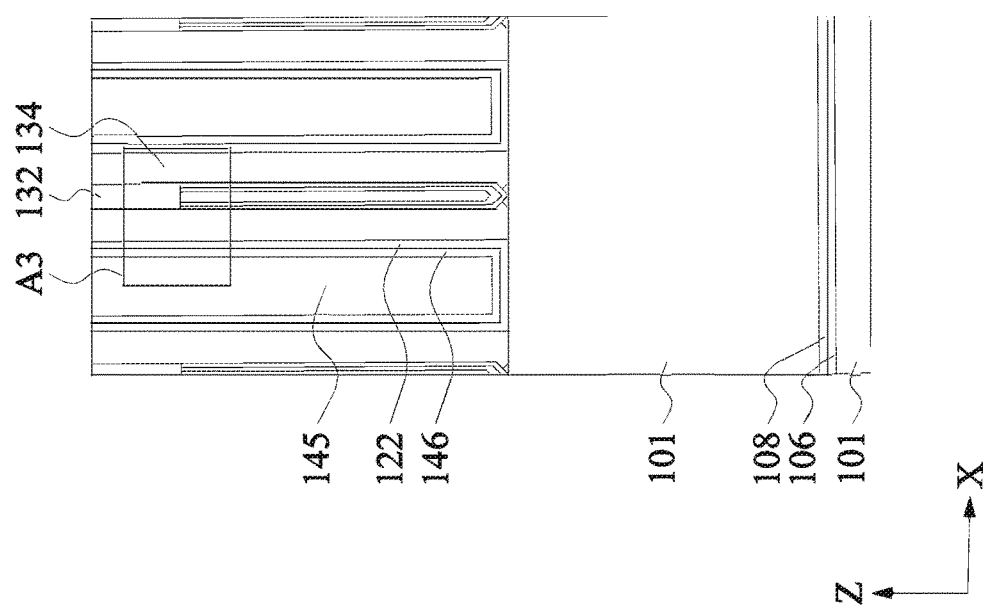

FIGS. 19A and 19B illustrate exemplary cross sectional views of a semiconductor device in accordance with some embodiments of the present disclosure. FIG. 19A corresponds to the line X2-X2 (between fin structures) of FIG. 7A and FIG. 19B is an enlarged view of the area A3 of FIG. 19A.

As shown in FIGS. 19A and 19B, the first insulating layer 122 and the second insulating layer 146 are interposed between the ILD layer 145 and the sidewall spacer 134 of the gate structure.

Figure 20B:
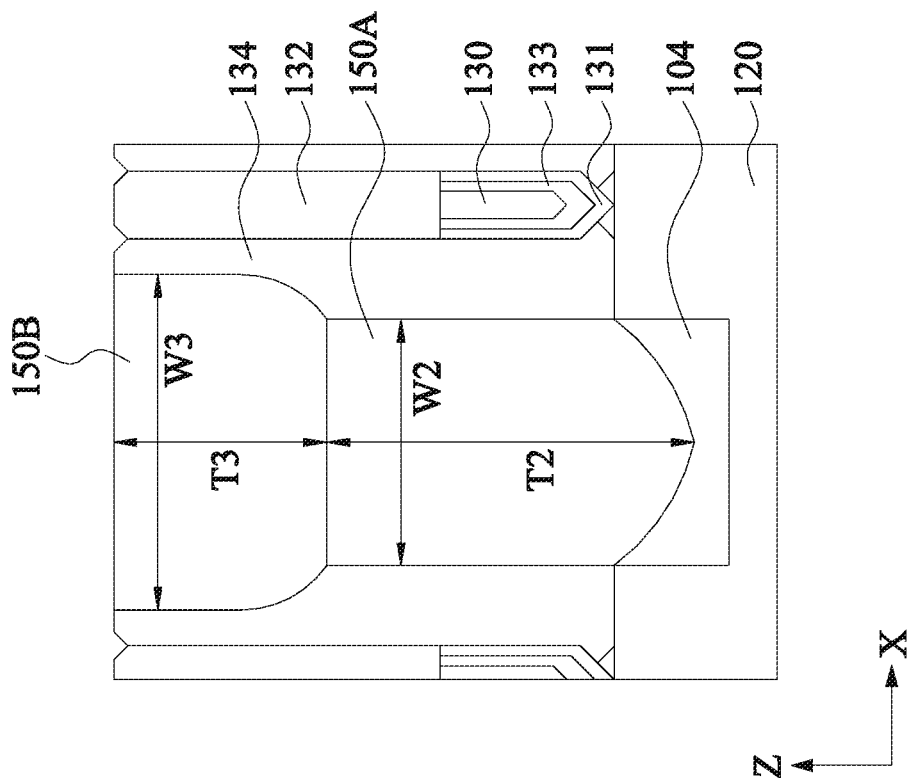
FIGS. 20A and 20B illustrate exemplary cross sectional views of a semiconductor device in accordance with some embodiments of the present disclosure.
Figure 20A:
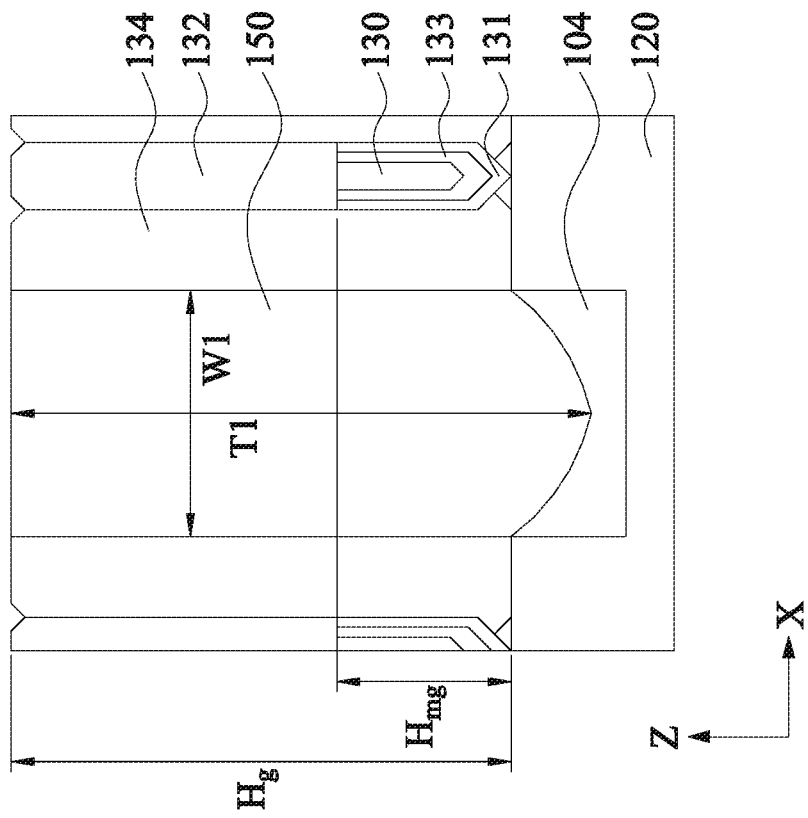

FIGS. 20A and 20B illustrate exemplary cross sectional views of a semiconductor device in accordance with some embodiments of the present disclosure. FIGS. 20A and 20B correspond to the area A2 of FIG. 7C.

FIGS. 20A and 20B show various cross sectional shapes of the contact 150 along the X direction. In some embodiments, the contact 150 has substantially a rectangular shape, because the sidewall spacer 134 is not etched and maintains its side surface undamaged. In some embodiments, the upper portion of the S/D epitaxial layer 120 has a recessed portion as shown in FIG. 20A. In other embodiments, the upper portion of the S/D epitaxial layer 120 has a concave shape, a raised shape or a flat shape.

The width W1 is substantially constant (except in the recessed portion of the S/D epitaxial layer 120) and is in a range from about 10 nm to about 40 nm and the height T1 is in a range from about 20 nm to about 100 nm in some embodiments. In some embodiments, the cross sectional shape of the contact 150 is tapered, i.e., trapezoid.

In certain embodiments, the upper portions of the sidewall spacers 134 are damaged (etched) during the formation of the openings 144 and/or openings 148, 149. Accordingly, the contact 150 has two regions, lower and upper regions. The upper region of the contact 150 has a funnel shape having a wider top than a body region along the X direction. The width W2 of the lower region is substantially constant (except in the recessed portion of the S/D epitaxial layer 120) through its height T2. The width W2 is in a range from about 10 nm to about 40 nm and the height T2 is in a range from about 20 nm to about 100 nm in some embodiments. In some embodiments, T2>T3. In certain embodiments, T2>2×T3.

The width of the upper region varies (e.g., increases) as the height T3 increases. The width W3 at the top of the contact 150 is greater than the width W2 and is in a range from about 10 nm to about 46 nm in some embodiments. T3 is less than about 7 nm in some embodiments. In certain embodiments, W3>W2 and W3-W2 is less than about 6 nm.

It will be understood that not all advantages have been necessarily discussed herein, no particular advantage is required for all embodiments or examples, and other embodiments or examples may offer different advantages.

For example, in the present disclosure, since material having a higher etching selectivity (e.g., Si) with respect insulating layers (e.g., silicon oxide based material, silicon nitride based material) is used as the second sacrificial layers, it is possible to more precisely control the size of the S/D structures and the S/D contact structure. With these manufacturing methods, the material can easily fill the space between sidewall spacers to form a void-free film. Further, the full space between sidewall spacer can be fully used for S/D contacts and less damage is caused to the contact regions. Since the area of the S/D contacts is wider, it is possible to form a wrap-around contact to gain contact area by higher selective etching to the silicon oxide and/or nitride. By the foregoing structures and methods, it is possible to avoid an S/D epitaxial layer from being damaged and to form wrap-around contact structures. In addition, the second insulating layer (liner layer) is disposed between an ILD and contact metal, and between metal gate and the ILD, it is possible to prevent oxygen and/or moisture penetration from the ILD to the contact region and/or the S/D epitaxial layers.

In accordance with an aspect of the present disclosure, in a method of forming a semiconductor device including fin field effect transistors (FinFETs), a first sacrificial layer is formed over a source/drain structure of a FinFET structure and an isolation insulating layer. The first sacrificial layer is patterned, thereby forming an opening. A first liner layer is formed on the isolation insulating layer in a bottom of the opening and on at least side faces of the patterned first sacrificial layer. After the first liner layer is formed, a dielectric layer is formed in the opening. After the dielectric layer is formed, the patterned first sacrificial layer is removed, thereby forming a contact opening over the source/drain structure. A conductive layer is formed in the contact opening.

In accordance with another aspect of the present disclosure, in a method of forming a semiconductor device including a fin field effect transistor (FinFET), a first sacrificial layer is formed over a first source/drain structure of a first FinFET structure, a second source/drain structure of a second FinFET structure and an isolation insulating layer. The first source/drain structure is disposed adjacent to the second source/drain structure. The first and second FinFET structures include a gate structure and sidewall spacers formed on opposing sides of the gate structure. The first sacrificial layer is patterned, thereby forming an opening between the first source/drain structure and the second source/drain structure. A dielectric layer is formed in the opening. After the dielectric layer is formed, the patterned first sacrificial layer is removed, thereby forming a first contact opening over the first source/drain structure and a second contact opening over the second source/drain structure. A first conductive layer is formed in the first contact opening and a second conductive layer is formed in the second contact opening. The first sacrificial layer is made of a different material than the isolation insulating layer, the dielectric layer and the sidewall spacers.

In accordance with another aspect of the present disclosure, a semiconductor device including fin field effect transistors (FinFETs), includes first and second FinFETs and a dielectric layer. The first FinFET includes a first fin structure extending in a first direction, a first source/drain structure and a first source/drain contact in contact with the first source/drain structure. The second FinFET is disposed adjacent to the first FinFET and includes a second fin structure extending in the first direction, a second source/drain structure and a second source/drain contact in contact with the second source/drain structure. The dielectric layer separates the first source/drain structure and the second source/drain structure. A liner layer made of a different dielectric material than the dielectric layer is disposed between the dielectric layer and the first source/drain contact.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including fin field effect transistors (FinFETs), comprising:
   an isolation insulating layer disposed over a substrate;
   a first FinFET including a first fin structure extending in a first direction, a first source/drain structure and a first source/drain contact in contact with the first source/drain structure, a channel region of the first fin structure protruding from the isolation insulating layer;
   a second FinFET disposed adjacent to the first FinFET and including a second fin structure extending in the first direction, a second source/drain structure and a second source/drain contact in contact with the second source/drain structure, a channel region of the second fin structure protruding from the isolation insulating layer; and
   a dielectric layer separating the first source/drain contact and the second source/drain contact,
   wherein two layers are disposed between a bottom of the dielectric layer and an upper surface of the isolation insulating layer.

2. The semiconductor device of claim 1, wherein at least one of the two layers s made of silicon nitride.

3. The semiconductor device of claim 1, wherein:
   the two layers include a first layer disposed on the isolation insulating layer and a second layer disposed on the first layer, and
   in a cross section along a second direction crossing the first direction, the second layer has a U-shape cross section and the first layer has a line-shape cross section.

4. The semiconductor device of claim 3, wherein in the cross section, a width of the first layer is smaller than a width of the dielectric layer.

5. The semiconductor device of claim 4, wherein a thickness of the second layer is greater than a thickness of the first layer.

6. The semiconductor device of claim 1, further comprising a residual piece of a semiconductor material disposed at a bottom corner of the dielectric layer.

7. The semiconductor device of claim 6, wherein the residual piece of the semiconductor material includes amorphous silicon or polysilicon.

8. The semiconductor device of claim 1, wherein the first source/drain structure includes an epitaxial layer formed around a source/drain region of the first fin structure that protrudes from the isolation insulating layer.

9. The semiconductor device of claim 8, wherein the first source/drain structure further includes a silicide layer disposed between the epitaxial layer and the first source/drain contact.

10. A semiconductor device including fin field effect transistors (FinFETs), comprising:
- an isolation insulating layer disposed over a substrate;
- a first FinFET including a first fin structure extending in a first direction, a first source/drain structure and a first source/drain contact in contact with the first source/drain structure, a channel region of the first fin structure protruding from the isolation insulating layer;
- a second FinFET disposed adjacent to the first FinFET and including a second fin structure extending in the first direction, a second source/drain structure and a second source/drain contact in contact with the second source/drain structure, a channel region of the second fin structure protruding from the isolation insulating layer; and
- a dielectric layer separating the first source/drain contact and the second source/drain contact,
- wherein two layers are disposed between a bottom of the dielectric layer and an upper surface of the isolation insulating layer, and
- a part of the first source/drain contact penetrate into the bottom of the dielectric layer.

11. The semiconductor device of claim 10, wherein the first source/drain contact is not in direct contact with the dielectric layer.

12. The semiconductor device of claim 10, wherein the first source/drain contact is not in direct contact with the two layers.

13. The semiconductor device of claim 10, wherein a width of at least one of the first source/drain contact and the second source/drain contact along a second direction crossing the first direction varies along a vertical direction perpendicular to a surface the substrate.

14. The semiconductor device of claim 13, wherein the width decreases as a distance from the substrate increases.

15. A semiconductor device including fin field effect transistors (FinFETs), comprising:
- an isolation insulating layer disposed over a substrate;
- a first FinFET including a first fin structure extending in a first direction, a first source/drain structure and a first source/drain contact in contact with the first source/drain structure, a channel region of the first fin structure protruding from the isolation insulating layer;
- a second FinFET disposed adjacent to the first FinFET and including a second fin structure extending in the first direction, a second source/drain structure and a second source/drain contact in contact with the second source/drain structure, a channel region of the second fin structure protruding from the isolation insulating layer; and
- a dielectric layer separating the first source/drain contact and the second source/drain contact,
- wherein two layers are disposed between a bottom of the dielectric layer and an upper surface of the isolation insulating layer,
- at least one of the first and second source/drain contacts includes a lower portion and an upper portion having a funnel shape, and
- a width of the upper portion is greater than a width of the bottom portion.

16. The semiconductor device of claim 15, wherein the width of the bottom portion is constant.

17. The semiconductor device of claim 15, wherein a difference between the width of the upper portion and the width of the bottom portion is less than 6 nm.

18. The semiconductor device of claim 15, wherein a vertical length of the bottom portion is greater than a vertical length of the upper portion.

19. The semiconductor device of claim 15, wherein the vertical length of the bottom portion is twice or more the vertical length of the upper portion.

20. The semiconductor device of claim 15, wherein:
- the first FinFET further includes a gate electrode, and
- an interface between the bottom portion and the upper portion is located at a level higher than an upper surface of the gate electrode.

* * * * *